US010878927B2

(12) United States Patent
Ema et al.

(10) Patent No.: US 10,878,927 B2
(45) Date of Patent: Dec. 29, 2020

(54) NON-VOLATILE SEMICONDUCTOR MEMORY DEVICE AND METHOD FOR REPROGRAMMING THEREOF

(71) Applicant: UNITED SEMICONDUCTOR JAPAN CO., LTD., Kuwana (JP)

(72) Inventors: Taiji Ema, Inabe (JP); Makoto Yasuda, Kuwana (JP)

(73) Assignee: UNITED SEMICONDUCTOR JAPAN CO., LTD., Kuwana (JP)

( * ) Notice: Subject to any disclaimer, the term of this patent is extended or adjusted under 35 U.S.C. 154(b) by 0 days.

(21) Appl. No.: 16/401,439

(22) Filed: May 2, 2019

(65) Prior Publication Data

US 2019/0371419 A1 Dec. 5, 2019

(30) Foreign Application Priority Data

Jun. 5, 2018 (JP) ................. 2018-107582

(51) Int. Cl.
*G11C 16/34* (2006.01)
*G11C 16/16* (2006.01)
*G11C 16/24* (2006.01)
*G11C 16/08* (2006.01)

(52) U.S. Cl.
CPC .......... *G11C 16/3495* (2013.01); *G11C 16/08* (2013.01); *G11C 16/16* (2013.01); *G11C 16/24* (2013.01); *G11C 16/3427* (2013.01); *G11C 16/3431* (2013.01)

(58) Field of Classification Search
CPC ..... G11C 16/3495; G11C 16/08; G11C 16/24; G11C 16/3427; G11C 16/3431

USPC ......................................................... 365/218
See application file for complete search history.

(56) References Cited

U.S. PATENT DOCUMENTS

| 6,097,059 A | 8/2000 | Yamada | |
|---|---|---|---|
| 10,354,737 B2* | 7/2019 | Hu | G11C 16/10 |
| 2006/0013043 A1 | 1/2006 | Matsuoka | |
| 2018/0374551 A1* | 12/2018 | Hu | G11C 16/349 |

FOREIGN PATENT DOCUMENTS

| JP | 11-31393 A | 2/1999 |
|---|---|---|
| JP | 2000-57782 A | 2/2000 |
| JP | 2006-31821 A | 2/2006 |

* cited by examiner

*Primary Examiner* — Xiaochun L Chen
(74) *Attorney, Agent, or Firm* — Westerman, Hattori, Daniels & Adrian, LLP

(57) ABSTRACT

A control circuit controls a column decoder and a row decoder to perform reprogramming where, before the count of reprogramming operations involving erasures, each targeting one of a plurality of memory cells included in a memory cell array, reaches a predetermined number, a first extent (e.g. a sub-block) including the targeted memory cell and being smaller than the entire extent of the memory cell array is used as the unit of reprogramming, and when the count of reprogramming operations reaches the predetermined number, a second extent (e.g. the memory cell array corresponding to one sector) including the targeted memory cell and being larger than the first extent is used as the unit of reprogramming, and resets the count of reprogramming operations each time it reaches the predetermined number.

16 Claims, 20 Drawing Sheets

NON-VOLATILE SEMICONDUCTOR MEMORY DEVICE AND METHOD FOR REPROGRAMMING THEREOF

CROSS-REFERENCE TO RELATED APPLICATION

This application is based upon and claims the benefit of priority of the prior Japanese Patent Application No. 2018-107582, filed on Jun. 5, 2018, the entire contents of which are incorporated herein by reference.

FIELD

The embodiments discussed herein are related to a non-volatile semiconductor memory device and method for reprogramming thereof.

BACKGROUND

Some non-volatile semiconductor memory devices use memory cells, each of which accumulates charge (hot carriers) in its floating gate, or sidewall dielectric layers formed on sidewalls of a gate electrode, to thereby store data.

To reprogram data stored in memory cells, such non-volatile semiconductor memory devices use a system of collectively processing each unit of a predetermined size, called sector, because of its operational simplicity.

However, in reprogramming data stored in memory cells included in a sector, even though the amount of data needing to be reprogrammed is so small that the reprogramming would involve only part of the sector, the entire sector is erased once and programming (writing) of new data then takes place. Therefore, a larger sector size would lead to decreased energy efficiency associated with reprogramming. In the case where program source code stored in a non-volatile semiconductor memory device is frequently updated for enhanced security reasons or the like, reprogramming often involves only a very small region within each sector. For this reason, it is preferable to arrange as small reprogrammable units as possible in a memory cell array.

Note that there are proposed techniques for enabling erasure of each individual memory cell.

See, for example, Japanese Laid-open Patent Publications No. 11-31393, No. 2000-57782, and No. 2006-31821.

However, in the case of setting a unit size programmable by a decoder smaller than the size of a region selectable by the same decoder, the amount of charge in each memory cell not targeted for reprogramming may shift during reprogramming operations. For example, when some of a plurality of memory cells sharing the same word or bit line are selected as reprogramming targets, each unselected memory cell amongst the plurality of memory cells may experience shifts in the charge amount. Such a phenomenon is called disturb (drain or gate disturb), and increased influence of disturb may result in degradation of data stored in the unselected memory cells.

SUMMARY

According to one aspect, there is provided a non-volatile semiconductor memory device including a memory cell array configured to include a plurality of word lines, a plurality of bit lines, and a plurality of memory cells each connected to one of the plurality of word lines and one of the plurality of bit lines and selected by a column decoder and a row decoder; and a control circuit configured to control the column decoder and the row decoder to perform reprogramming where, before a count of reprogramming operations involving erasures, each targeting one of the plurality of memory cells, reaches a predetermined number, a first extent including the targeted memory cell and being smaller than an entire extent of the memory cell array is used as a unit of reprogramming, and when the count of reprogramming operations reaches the predetermined number, a second extent including the targeted memory cell and being larger than the first extent is used as the unit of reprogramming, and reset the count of reprogramming operations each time the count of reprogramming operations reaches the predetermined number.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Several embodiments will be described below with reference to the accompanying drawings.

(a) First Embodiment

Figure 1:
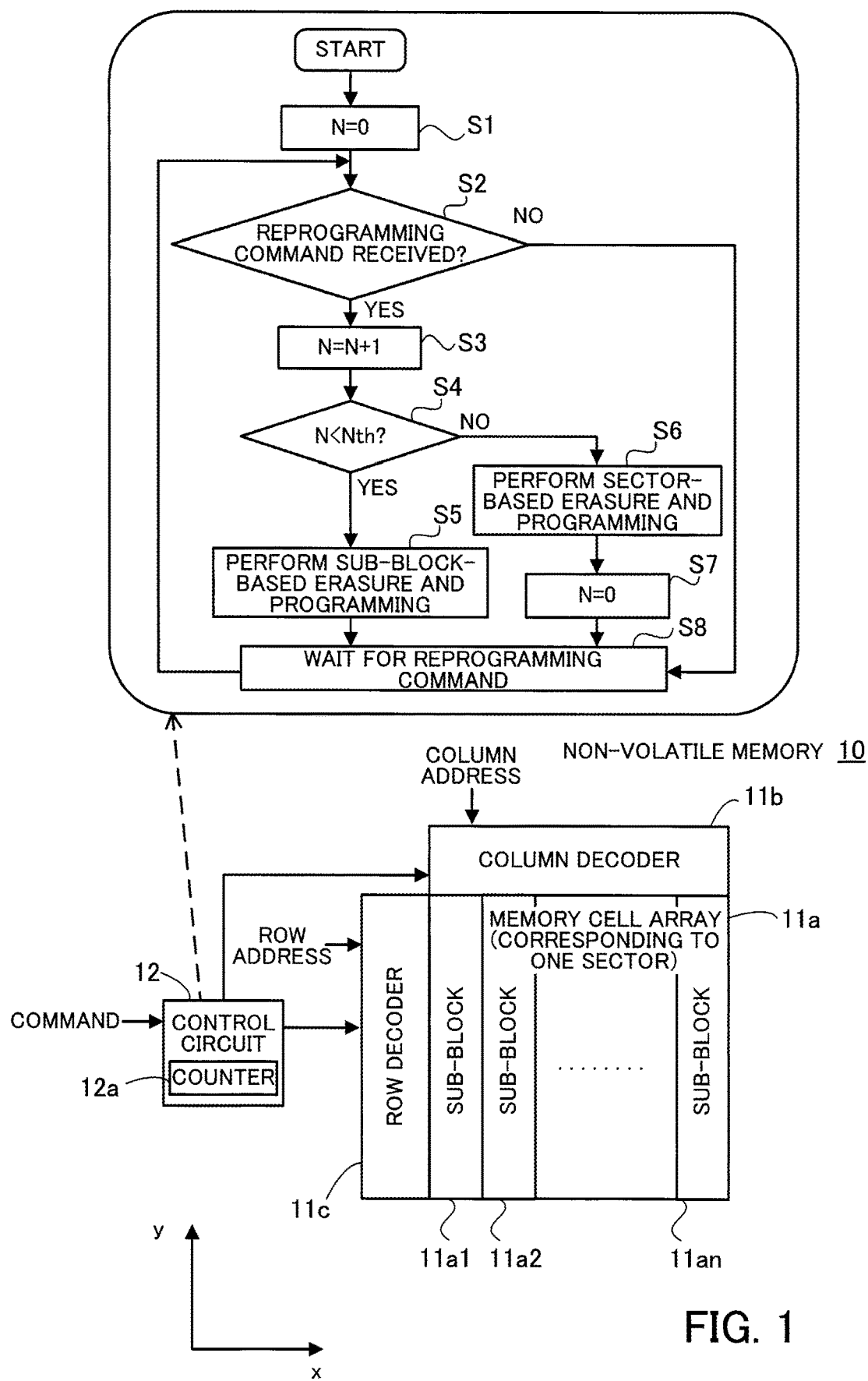
FIG. 1 illustrates an exemplary non-volatile semiconductor memory device according to a first embodiment.

FIG. 1 illustrates an exemplary non-volatile semiconductor memory device according to a first embodiment.

A non-volatile semiconductor memory device (hereinafter simply referred to as "non-volatile memory") 10 includes a memory cell array 11a, a column decoder 11b, a row decoder 11c, and a control circuit 12.

FIG. 1 depicts the memory cell array 11a corresponding to one sector, the column decoder 11b, and the row decoder 11c; however, the non-volatile memory 10 may include multiple sets of these features. Although not illustrated in FIG. 1, the memory cell array 11a includes a plurality of word lines, a plurality of bit lines, and a plurality of memory cells each connected to one of the word lines and one of the bit lines. Each memory cell is selected by the column decoder 11b and the row decoder 11c based on column and row addresses. Such memory cells are implemented, for example, using sidewall trapping memory transistors each storing data by accumulating charge in sidewall dielectric layers formed on sidewalls of a gate electrode. Alternatively, floating gate memory transistors may be used, each storing data by accumulating charge in a floating gate.

Note that FIG. 1 omits representation of, for example, sense amplifiers.

The control circuit 12 controls the column decoder 11b and the row decoder 11c in response to a command supplied thereto. The control circuit 12 also counts the number of reprogramming operations involving erasure, each performed on one of the memory cells included in the memory cell array 11a. Then, until the number of reprogramming operations reaches a predetermined number, the control circuit 12 exercises control over the column decoder 11b and the row decoder 11c in such a manner as to have the unit of reprogramming smaller than the entire memory cell array 11a. The predetermined number is set, for example, based on an acceptable level of shifts in threshold voltages, caused by the influence of disturb occurring in unselected memory cells (i.e., those not targeted for reprogramming) during reprogramming. For example, the acceptable level is determined in consideration of predetermined margins so that data stored in each unselected memory cell would not be flipped from 0 to 1 or from 1 to 0.

In the example of FIG. 1, the control circuit 12 controls the column decoder 11b and the row decoder 11c to have, as the unit of reprogramming, memory cell groups individually included in one of a plurality of regions formed by dividing the memory cell array 11a. A plurality of regions (hereinafter referred to as "sub-blocks") 11a1, 11a2, . . . , and 11an depicted in FIG. 1 is formed by dividing the memory cell array 11a into multiple sections along the y direction (the direction perpendicular to a plurality of word lines (not illustrated)). That is, the word lines (not illustrated) extend in the x direction.

The control circuit 12 includes, for example, a counter 12a for counting the aforementioned number of reprogramming operations. Note that the number of reprogramming operations is counted for each sector. Therefore, the control circuit 12 may include counters dedicated to the individual sectors.

Further, when the number of reprogramming operations reaches the predetermined number, the control circuit 12 controls the column decoder 11b and the row decoder 11c to implement reprogramming over the entire memory cell array 11a (one sector). Then, the control circuit 12 resets the number of reprogramming operations each time it reaches the predetermined number.

FIG. 1 includes a flowchart illustrating an exemplary operation flow of the non-volatile memory 10.

First, the control circuit 12 initializes a count value N of the counter 12a to 0 (step S1). The count value N indicates the number of reprogramming operations, each targeting one of the memory cells included in the memory cell array 11a. After step S1, the control circuit determines whether to have received a command for reprogramming a memory cell in the memory cell array 11a of the non-volatile memory 10 (step S2). If no command for reprogramming a memory cell in the memory cell array 11a is received, the control circuit 12 enters a wait state (step S8), and then returns to step S2.

When having received a command for reprogramming a memory cell of the memory cell array 11a, the control circuit 12 increments the count value N of the counter 12a by 1 (step S3). Then, the control circuit 12 determines whether the count value N is less than a predetermined number Nth (step S4).

When the count value N is less than the predetermined number Nth, erasure and reprogramming are performed on a sub-block basis under the control of the control circuit 12 (step S5).

In step S5, the control circuit 12 causes, for example, a storing unit (not illustrated), such as registers or a static random access memory (SRAM), to temporarily retain data stored in individual memory cells included in a sub-block corresponding to a designated column address. Subsequently, the control circuit 12 updates the data retained in the storing unit with new data supplied with the reprogramming command. Further, under the control of the control circuit 12, the data stored in the memory cells of the reprogramming-target sub-block is erased, and the data retained in the storing unit is then written to the reprogramming-target sub-block.

On the other hand, when the count value N reaches the predetermined number Nth, erasure and reprogramming are performed on a sector basis under the control of the control circuit 12 (step S6).

In step S6, the control circuit 12 causes, for example, a storing unit (not illustrated) to temporarily retain data stored in all the memory cells of the memory cell array 11a. Subsequently, the control circuit 12 updates the data retained in the storing unit with new data supplied with the reprogramming command. Further, under the control of the control circuit 12, the data stored in all the memory cells of the memory cell array 11a is erased, and the data retained in the storing unit is then written to all the memory cells of the memory cell array 11a.

After step S6, the control circuit 12 resets the count value N to 0 (step S7). After step S5 or S7, the control circuit 12 moves to step S8. Then, with each reception of a reprogramming command, the control circuit 12 repeats the process from step S3.

Note that the sequence of the processing steps in FIG. 1 is merely an example and may be changed accordingly.

According to the above-described non-volatile memory 10, the unit of reprogramming is set smaller than the entire memory cell array 11a until the number of reprogramming operations remains below the predetermined number. Therefore, unselected memory cells are subject to disturb during the reprogramming operations. However, when the number of reprogramming operations reaches the predetermined number, the control circuit 12 performs reprogramming using a larger reprogramming unit, to thereby reset the influence of disturb. This reduces degradation of stored data.

For example, in the case of implementing a sub-block-based reprogramming operation involving erasure as depicted in FIG. 1, gate disturb occurs in individual memory cells of unselected sub-blocks because they are connected to the same word lines as memory cells of a sub-block targeted for reprogramming. Sub-blocks left continuously unselected a number of times during reprogramming operations are heavily affected by gate disturb, which induces shifts in the threshold voltages of the memory cells. However, according to the above-described non-volatile memory 10 of the first embodiment, a sector-based reprogramming operation takes place each time the number of reprogramming operations reaches a predetermined number. Herewith, the shifted threshold voltages are restored back to normal, thereby reducing degradation of stored data.

Note that since the sub-blocks 11a1 to 11an are formed by dividing the memory cell array 11a along a direction perpendicular to the word lines, different sub-blocks do not share bit lines. Therefore, during each sub-block-based reprogramming operation involving erasure, memory cells of unselected sub-blocks are free from the influence of drain disturb.

Thus, the non-volatile memory 10 according to the first embodiment reduces degradation of stored data in the case of having a unit size programmable by decoders (e.g. sub-block) smaller than the size of a region selectable by the same decoders (sector).

In addition, until the number of reprogramming operations reaches a predetermined number, the reprogramming operations are performed on a sub-block basis, which improves energy efficiency and, therefore, reduces power consumption compared to the case of performing sector-based reprogramming every time.

Reducing the sector size itself may be considered as one way of making the unit of reprogramming smaller while reducing the influence of disturb; however, this results in increased amount of circuitry such as decoders. On the other hand, the non-volatile memory 10 according to the first embodiment has, as the unit of reprogramming, the sub-blocks 11a1 to 11an formed by dividing the memory cell array 11a corresponding to one sector, thus preventing an increase in the amount of circuitry.

(b) Second Embodiment

Figure 2:
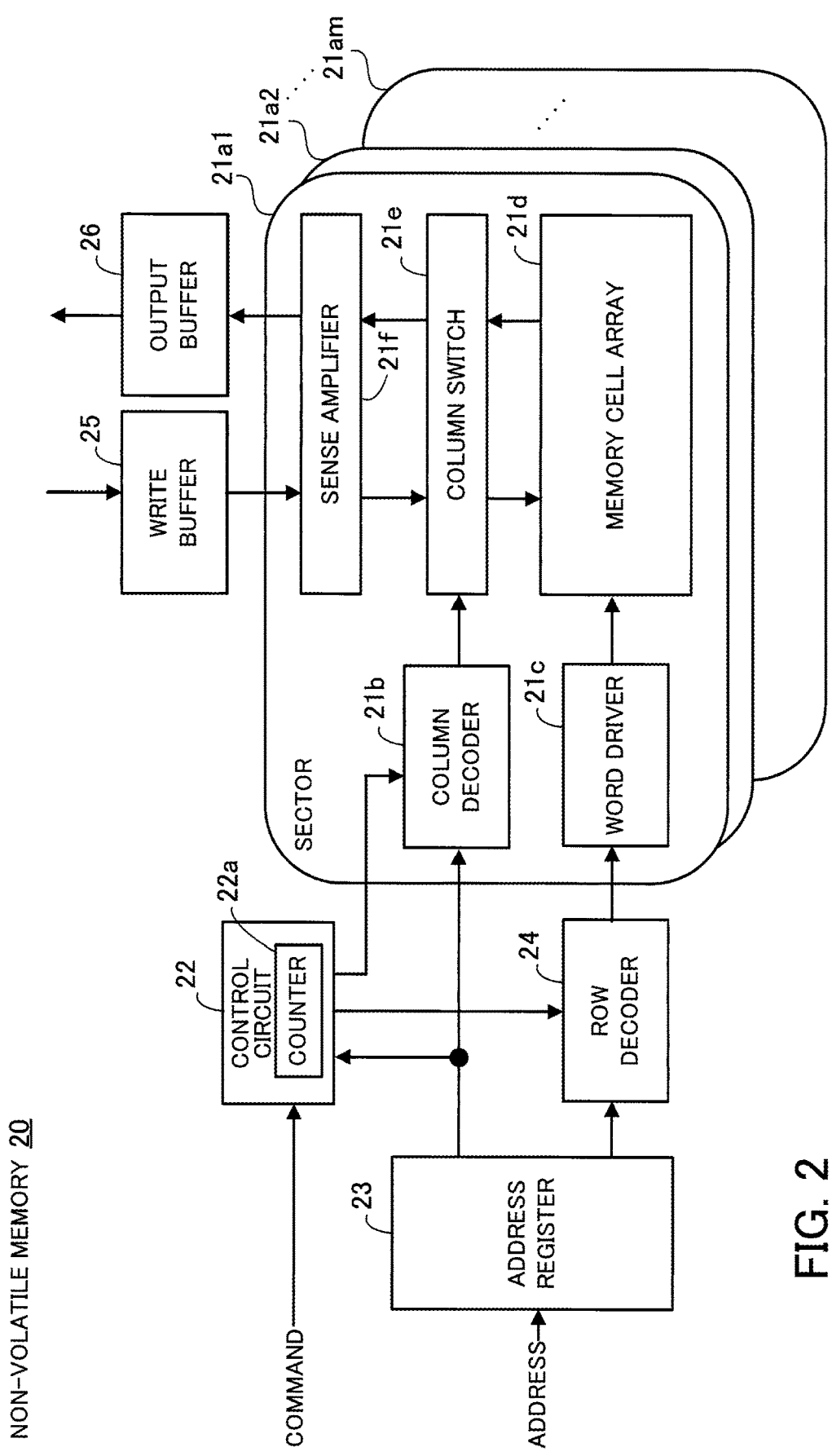
FIG. 2 is an overall block diagram of an exemplary non-volatile memory according to a second embodiment.

FIG. 2 is an overall block diagram of an exemplary non-volatile memory according to a second embodiment.

A non-volatile memory 20 includes sectors 21a1, 21a2, . . . , and 21am, a control circuit 22, an address register 23, a row decoder 24, a write buffer 25, and an output buffer 26.

The sector 21a1 includes a column decoder 21b, a word driver 21c, a memory cell array 21d, a column switch 21e, and a sense amplifier 21f. Each of the remaining sectors 21a2 to 21am includes similar elements to those of the sector 21a1.

The column decoder 21b outputs a signal for selecting memory cells connected to a bit line corresponding a column address supplied from the address register 23, amongst a plurality of bit lines (not illustrated) of the memory cell array 21d.

The word driver 21c applies a predetermined voltage to one of a plurality of word lines (not illustrated) of the memory cell array 21d based on a signal output from the row decoder 24.

The memory cell array 21d includes a plurality of bit lines, a plurality of word lines, a plurality of source lines, and a plurality of memory cells although they are not illustrated in FIG. 2.

The column switch 21e connects one of the bit lines to the sense amplifier 21f based on the signal output from the column decoder 21b.

The sense amplifier 21f amplifies data (a voltage value) read from the memory cell array 21d and outputs the amplified data.

The control circuit 22 controls the column decoder 21b and the row decoder 24 based on a received command and the column address supplied from the address register 23. Note that the control circuit 22 includes a counter 22a. The counter 22a may be provided externally to the control circuit 22.

The address register 23 receives an address, and then supplies a row address to the row decoder 24 and a column address to the control circuit 22 and the column decoder 21b.

The row decoder 24 outputs a signal used to select memory cells connected to a word line corresponding to the row address supplied from the address register 23.

The write buffer 25 receives data to be written to memory cells and supplies it to the sectors 21a1 to 21am.

The output buffer 26 retains data read from the sectors 21a1 to 21am and outputs it.

Note that, in the memory cell array 21d described later, when data is written to a memory cell, a voltage may be applied also to a source line connected to the memory cell although FIG. 2 omits a structure associated with this. In addition, for some types of memory cells, high voltages are used for data erasure and programming; however, FIG. 2 omits a circuit for generating high voltage, such as a booster circuit.

Figure 3:
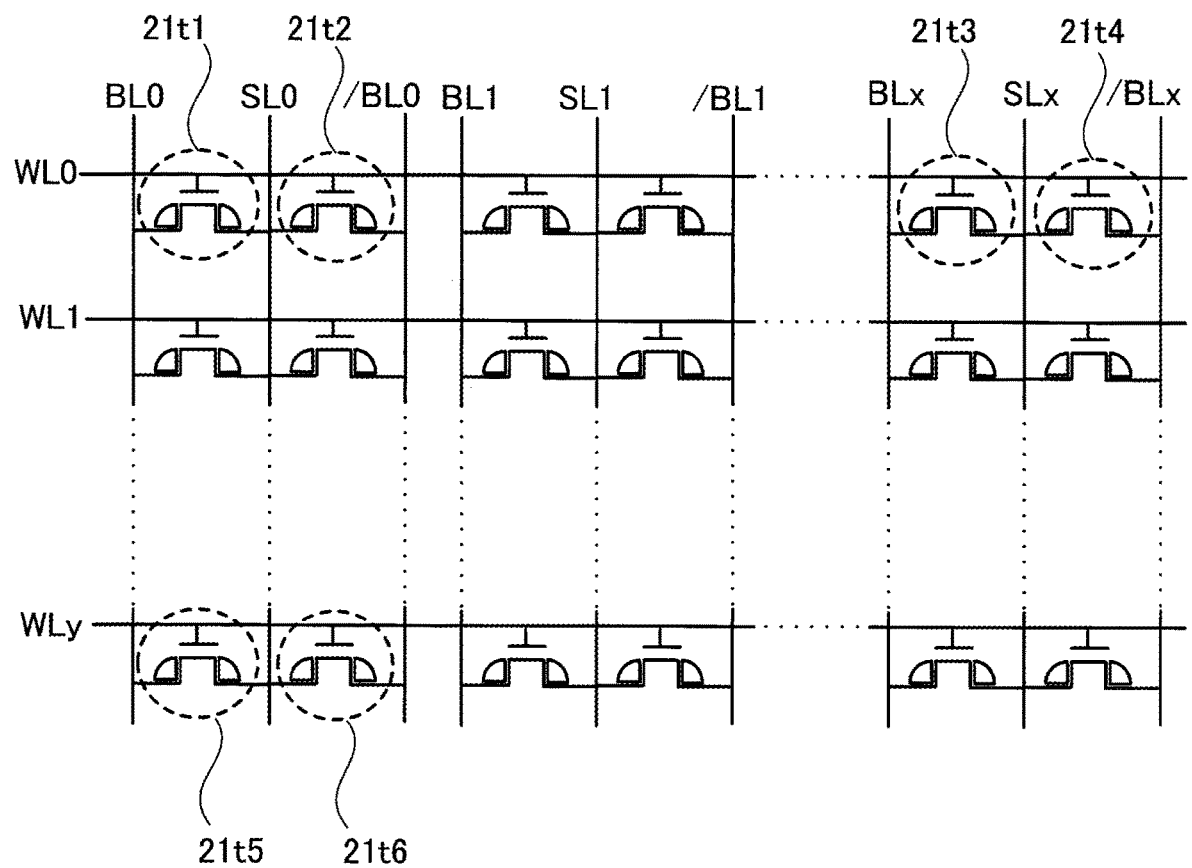
FIG. 3 illustrates an exemplary memory cell array.

FIG. 3 illustrates an exemplary memory cell array. In the example of FIG. 3, the memory cell array 21d includes a plurality of memory transistors (for example, memory transistors 21t1 to 21t6) for storing data by accumulating charge (hot carriers) in their sidewall dielectric layers.

Note that, in the memory cell array 21d of FIG. 3, two memory transistors (a memory transistor pair) function as a memory cell for storing one-bit data. In the case of storing "1" in one of the paired memory transistors, "0" is stored in the other.

As for one memory transistor of each pair (e.g. the memory transistors 21t1, 21t3, and 21t5), the drain is connected to one of bit lines BL0, BL1, . . . , and BLx. As for the other memory transistor of each pair (e.g. the memory transistors 21t2, 21t4, and 21t6), the drain is connected to one of bit lines /BL0, /BL1, . . . , and /BLx. The source of each paired memory transistor is connected to one of source lines SL0, SL1, . . . , and SLx. The gate of each paired memory transistor is connected to one of word lines WL0, WL1, . . . , and WLy.

FIG. 3 above illustrates an example of implementing each one-bit memory cell by paired memory transistors; however, such a one-bit memory cell may be formed of a single memory transistor.

Figure 4A:
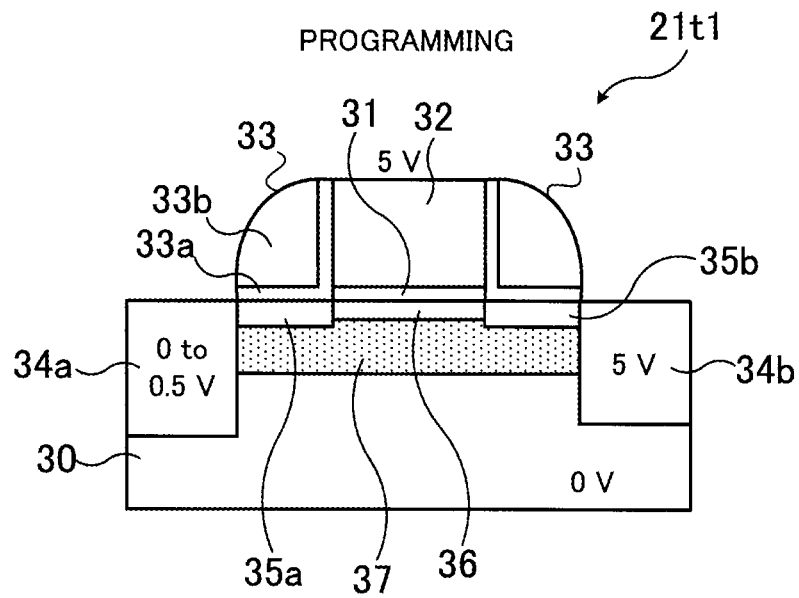
FIGS. 4A and 4B illustrate exemplary cross-section structures of a memory transistor during programming and erasure operations, respectively.
Figure 4B:
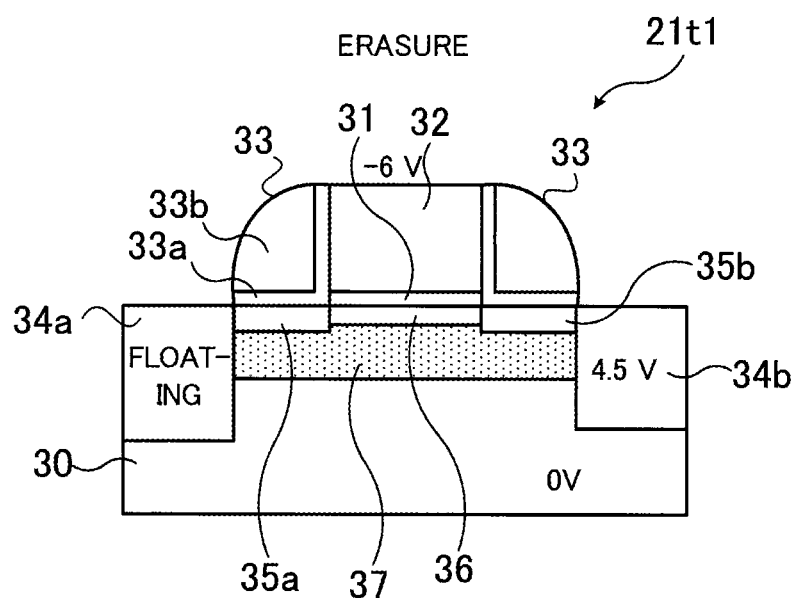

FIGS. 4A and 4B illustrate exemplary cross-section structures of a memory transistor during reprogramming and erasure operations, respectively.

The memory transistor 21t1 includes a gate dielectric layer 31 located above a semiconductor substrate 30, a gate electrode 32 overlying the gate dielectric layer 31, and sidewall dielectric layers 33 formed on sidewalls of the gate electrode 32 and above the semiconductor substrate 30. Each of the sidewall dielectric layers 33 includes, for example, a structure with dielectric oxide film 33a and nitride film 33b stacked on top of one another. The memory transistor 21t1 further includes impurity regions 34a and 34b each formed in the semiconductor substrate 30, on either side of the gate electrode 32 along the gate length direction. One of the impurity regions 34a and 34b functions as the source region and the other as the drain region. The memory transistor 21t1 may also include lightly doped drain (LDD) regions 35a and 35b each formed in the semiconductor substrate 30, on the inner side of the impurity regions 34a and 34b, respectively, below the sidewall dielectric layers 33. The memory transistor 21t1 further includes a channel region 36 located below the gate electrode 32, between the impurity regions 34a and 34b (or the LDD regions 35a and 35b), and an impurity region 37 underlying the channel region 36.

During programming the above-described memory transistor 21t1, for example, the semiconductor substrate is kept at a ground potential (e.g. 0 V) while a voltage in a range of 0 to 0.5 V is applied to the impurity region 34a, a voltage of 5 V to the impurity region 34b, and a voltage of 5 V to the gate electrode 32. Herewith, hot electrons generated near the impurity region 34b are injected into the sidewall dielectric layers 33 and accumulate therein, thereby causing data to be written to the memory transistor 21t1.

On the other hand, during erasure of the memory transistor 21t1, for example, the semiconductor substrate 30 is kept at a ground potential and the impurity region 34a is left floating while a voltage of 4.5 V is applied to the impurity region 34b, and a voltage of −6 V is applied to the gate electrode 32. Herewith, electrons accumulating in the sidewall dielectric layers 33 are neutralized by hot holes generated near the impurity region 34b, thereby causing data to be erased from the memory transistor 21t1.

In the following, the expression 'to write "0"' means to inject hot electrons into the sidewall dielectric layers 33, as described above, and the expression 'to set data of the memory transistor 21t1 to "1"' (in other words, 'to write "1"') means to erase data from the memory transistor 21t1.

To write "0" to the memory transistor 21t1 in the memory cell array 21d of FIG. 3, for example, a voltage of 5 V is applied to the word line WL0, a voltage of 5 V to the source line SL0, and a voltage in a range of 0 to 0.5 V to the bit line BL0. Further, a voltage of 5 V is applied to the bit line /BL0, and the remaining bit lines BL1 to BLx and /BL1 to /BLx, source lines SL1 to SLx, word lines WL1 to WLy are set to 0 V.

At this time, amongst memory transistors not targeted for programming (unselected memory transistors), memory transistors connected to the word line WL0 (e.g. the memory transistors 21t3 and 21t4) are affected by gate disturb. Also, amongst the unselected memory transistors, those connected to the source line SL0 (or the bit line BL0 or /BL0) (e.g. the memory transistors 21t5 and 21t6) are affected by drain disturb.

However, since the programming time is relatively short (e.g. 10 μsec), the disturb poses no problem as long as the number of programming operations does not drastically increase.

On the other hand, to erase data from the memory transistor 21t1 in the memory cell array 21d of FIG. 3, "0" is written once to the memory transistor 21t2 paired with the memory transistor 21t1. Although this step optional, making programming histories of the paired memory transistors equivalent to one another reduces variations in characteristics between them. Subsequently, for example, a voltage of −6 V is applied to the word line WL0 and a voltage of 4.5 V to the source line SL0 while the bit lines BL0 to BLx and /BL0 to /BLx are left floating. The remaining source lines SL1 to SLx and word lines WL1 to WLy are set to 0 V. Herewith, data of both the memory transistors 21t1 and 21t2 is set to "1".

At this time, amongst memory transistors not targeted for erasure (unselected memory transistors), memory transistors connected to the word line WL0 are affected by gate disturb, as is the case with programming data into the memory transistor 21t1. Also, amongst the unselected memory transistors, those connected to the source line SL0 (or the bit line BL0 or /BL0) are affected by drain disturb.

Since an erasure time is long (e.g. 100 msec) compared to a programming time, the disturb has profound impact on the unselected memory transistors.

Figure 5:
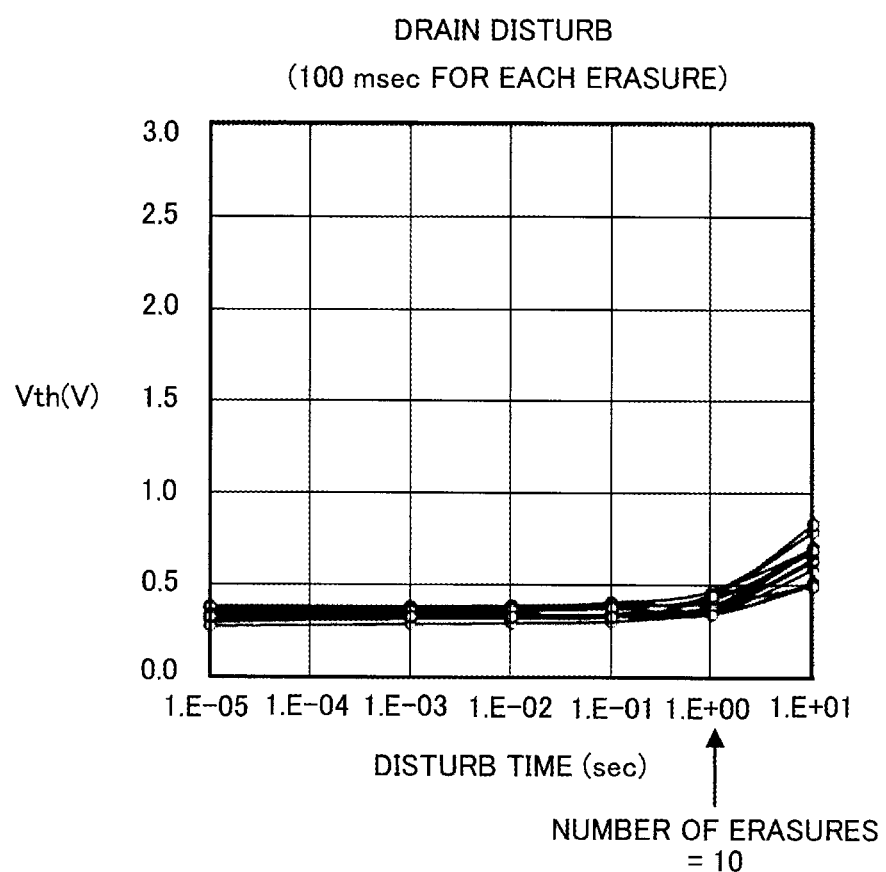
FIG. 5 illustrates impact of drain disturb occurring in unselected memory transistors during erasures.

FIG. 5 illustrates impact of drain disturb occurring in unselected memory transistors during erasures. The horizontal axis is disturb time (sec) and the vertical axis is threshold voltage Vth (V).

In FIG. 5, shifts in the threshold voltage Vth represent the impact of drain disturb on a memory transistor in erased state (having "1" written thereto) when a different memory transistor sharing the same source line as the memory transistor in erased state undergoes a plurality of erasing operations. A single erasing operation takes 100 msec. The data of FIG. 5 analyzed here is collected from a plurality of samples of a memory transistor which stores data by accumulating charge (hot carriers) in its sidewall dielectric layers, as illustrated in FIG. 3. The samples used have different threshold voltages Vth before being subject to drain disturb.

As represented in FIG. 5, after the disturb time exceeds 1.E+00 (sec) (corresponding to 10 erasing operations), shifts in the threshold voltages Vth become more significant. Therefore, in the following, the acceptable level of shifts in the threshold voltage Vth of an unselected memory transistor due to drain disturb is set to a threshold voltage shift observed when the number of erasing operations reaches 10.

Figure 6:
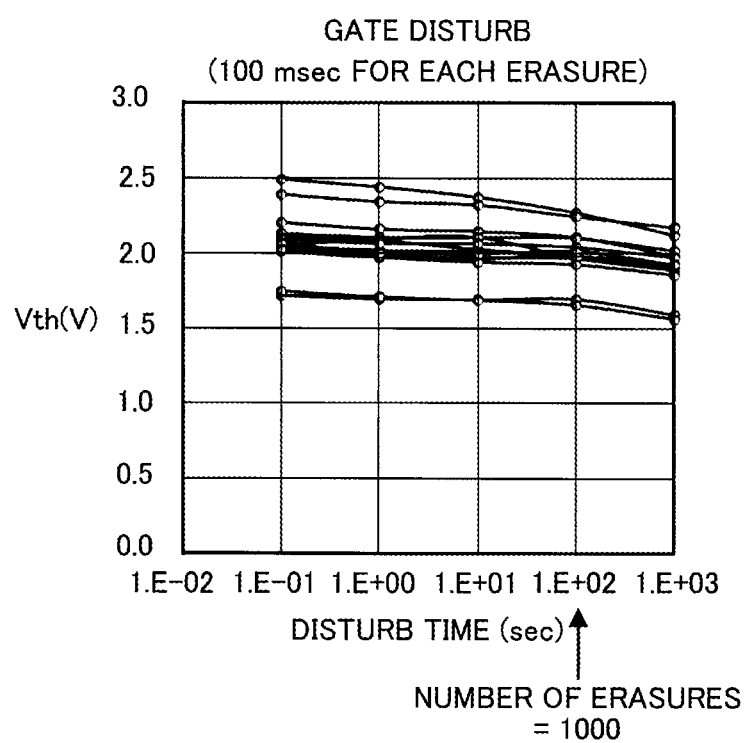
FIG. 6 illustrates impact of gate disturb occurring in unselected memory transistors during erasures.

FIG. 6 illustrates impact of gate disturb occurring in unselected memory transistors during erasures. The horizontal axis is disturb time (sec) and the vertical axis is threshold voltage Vth (V).

In FIG. 6, shifts in the threshold voltage Vth represent the impact of gate disturb on a memory transistor having "0" written thereto when a different memory transistor sharing the same word line as the memory transistor with "0" undergoes a plurality of erasing operations. A single erasing operation takes 100 msec. The data of FIG. 6 analyzed here is collected from a plurality of samples of a memory transistor which stores data by accumulating charge (hot carriers) in its sidewall dielectric layers, as illustrated in FIG. 3. The samples used have different threshold voltages Vth before being subject to gate disturb.

As represented in FIG. 6, after the disturb time exceeds 1.E+02 (sec) (corresponding to 1000 erasing operations), shifts in the threshold voltages Vth become more significant. Therefore, in the following, the acceptable level of shifts in the threshold voltage Vth of an unselected memory transistor due to gate disturb is set to a threshold voltage shift observed when the number of erasing operations reaches 1000.

In order to reduce the above-described impact of disturb during erasures, the non-volatile memory 20 of the second embodiment performs reprogramming operations that have, as the unit of reprogramming, a plurality of sub-blocks formed by dividing the memory cell array 21d of the sector 21a1 along a direction perpendicular to the word lines. Then, the non-volatile memory 20 reprograms the entire memory cell array 21d corresponding to one sector when the number of reprogramming operations reaches a predetermined number.

Figure 7:
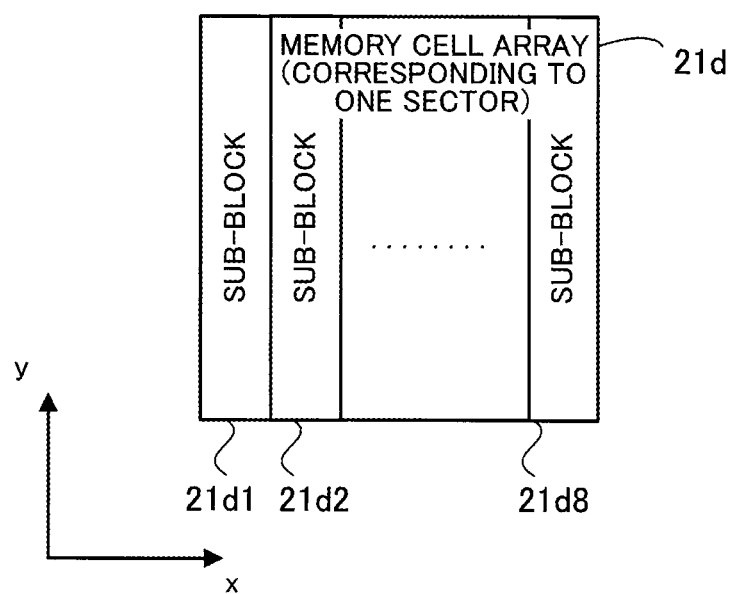
FIG. 7 illustrates an example in which a memory cell array corresponding to one sector is divided into a plurality of sub-blocks.

FIG. 7 illustrates an example in which a memory cell array corresponding to one sector is divided into a plurality of sub-blocks.

In the example of FIG. 7, eight sub-blocks 21d1, 21d2, . . . , and 21d8 are formed by dividing the one-sector memory cell array 21d along the y direction (i.e., along a direction perpendicular to word lines (not illustrated)). That is, the word lines (not illustrated) extend in the x direction.

For example, in the case where 256 word lines and 256 bit line pairs (e.g. the bit lines BL0 and /BL0 form one bit line pair) are provided in the one-sector memory cell array 21d, each of the sub-blocks 21d1 to 21d8 retains 1K byte data. That is, the entire memory cell array 21d retains 8K byte data.

The control circuit 22 controls the column decoder 21b and the row decoder 24 in such a manner that the sub-blocks 21d1 to 21d8 are the unit of reprogramming (1K bytes each in the example above) until the number of reprogramming operations reaches a predetermined number.

Because the sub-blocks 21d1 to 21d8 are formed by dividing the memory cell array 21d along a direction perpendicular to the word lines, different sub-blocks do not share bit lines. Therefore, memory cells of unselected sub-blocks are not affected by drain disturb during sub-block-based reprogramming operations involving erasures.

On the other hand, gate disturb occurs in individual memory cells of unselected sub-blocks during the sub-block-based reprogramming operations involving erasures because they are connected to the same word lines as memory cells of a reprogramming-target sub-block. Sub-blocks left continuously unselected a number of times during reprogramming operations are heavily affected by gate disturb. Then, once the number of erasures exceeds 1000, the threshold voltages Vth of memory cells (memory transistors) having "0" written thereto start decreasing further, as illustrated in FIG. 6.

According to the non-volatile memory 20 of the second embodiment, sector-based reprogramming takes place, for example, each time the number of reprogramming operations (i.e., the number of erasures) reaches 1000. Suppose that 999 reprogramming operations have been completed, in each of which one of the sub-blocks 21d1 to 21d8 is a reprogramming target. Even if there is a sub-block which was never targeted for reprogramming during the 999 reprogramming operations, it is subject to reprogramming in the 1000th operation. This prevents shifts in the threshold voltages Vth due to gate disturb from exceeding the acceptable level and also restores the shifted threshold voltages Vth back to normal, thereby reducing degradation of stored data.

Next described is an example of how the non-volatile memory 20 operates during reprogramming operations.

The following description focuses on reprogramming operations on memory cells included in the memory cell array 21d of the sector 21a1. Note, however, that reprogramming operations on memory cells included in memory cell arrays of the remaining sectors 21a2 to 21am are performed in a similar manner.

Figure 8:
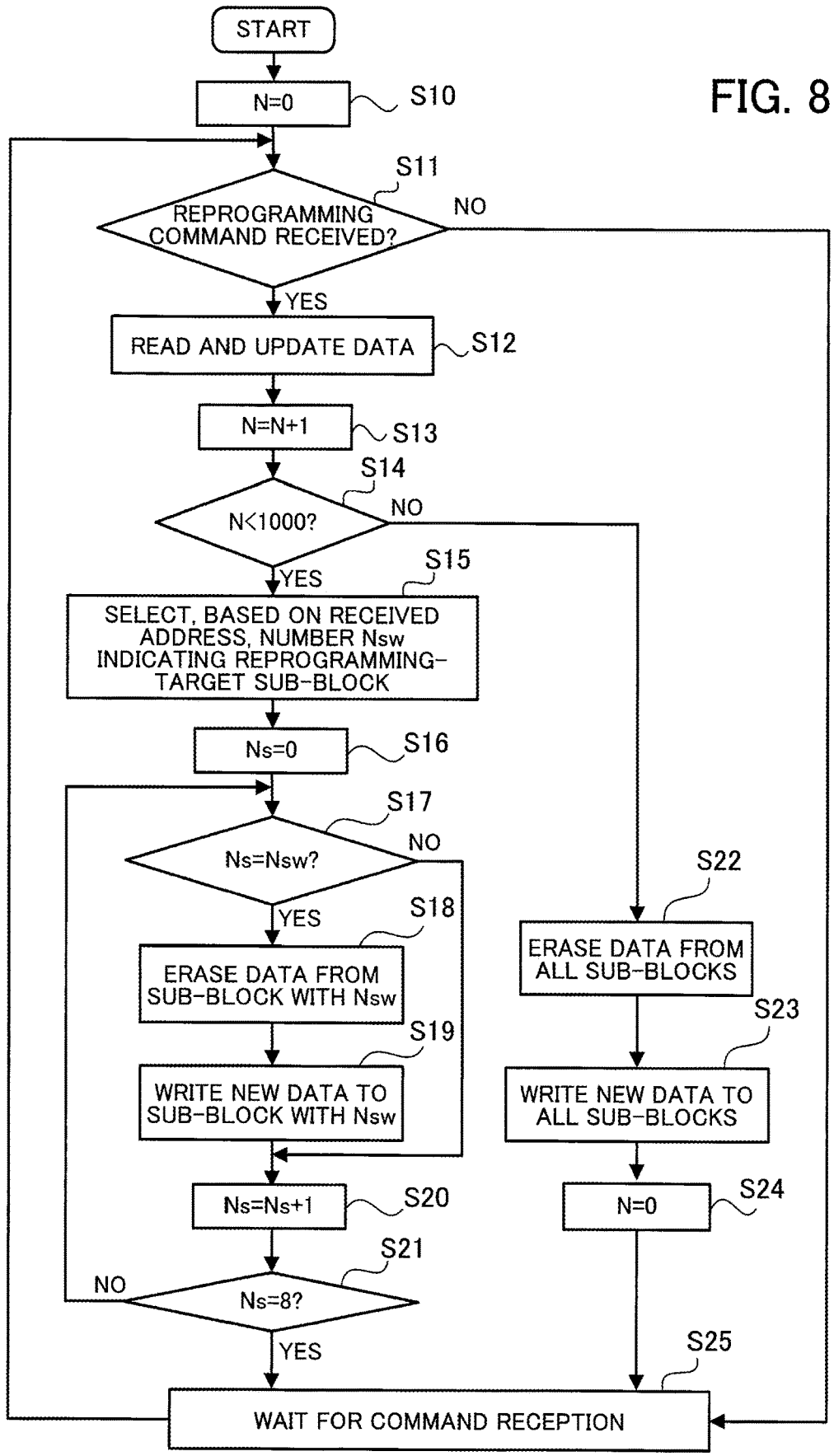
FIG. 8 is a flowchart illustrating an exemplary operation flow of the non-volatile memory during reprogramming.

FIG. 8 is a flowchart illustrating an exemplary operation flow of the non-volatile memory during reprogramming.

First, the control circuit 22 initializes the count value N of the counter 22a to 0 (step S10). The count value N indicates the number of reprogramming operations, each targeting one of the memory cells included in the memory cell array 21d. After step S10, the control circuit 22 determines whether to have received a command for reprogramming a memory cell in the memory cell array 21d (step S11). If having not received such a reprogramming command, the control circuit 22 enters a wait state (step S25) and then returns to step S11.

If having received a command for reprogramming a memory cell of the memory cell array 21d, the control circuit 22 reads data stored in all the memory cells of the memory cell array 21d and causes a storing unit (not illustrated), such as registers or a SRAM, to temporarily retain the read data. Subsequently, the control circuit 22 updates the data retained in the storing unit with new data supplied together with the reprogramming command (step S12).

Subsequently, the control circuit 22 increments the count value N of the counter 22a by 1 (step S13) and then determines whether the count value N is less than 1000 (step S14). Note that the value of 1000 is set in consideration of the acceptable level of shifts in the threshold voltages Vth illustrated in FIG. 6; however, this value is merely an example and the embodiments herein are not limited in this respect.

If the count value N is less than 1000, the control circuit 22 selects a number that indicates a reprogramming-target sub-block, based on a received address (column address) (step S15). The number indicating a reprogramming-target sub-block is hereinafter referred to as the number Nsw. The number Nsw takes one of 0, 1, 2, 3, 4, 5, 6, and 7 since the memory cell array 21d is divided into the eight sub-blocks 21d1 to 21d8, as illustrated in FIG. 7. The number Nsw is retained, for example, in a register (not illustrated).

Next, the control circuit 22 sets a number Ns (ranging from 0 to 7) for identifying a sub-block to 0 (step S16). The number Ns may be indicated by a counter (different from the counter 22a).

Subsequently, the control circuit 22 determines whether Ns is equal to Nsw (Ns=Nsw) (step S17). If Ns=Nsw, the control circuit 22 controls the column decoder 21b and the row decoder 24 to erase data of a sub-block with the number Nsw (step S18). The control circuit 22 then controls the column decoder 21b and the row decoder 24 to write, into the sub-block with the number Nsw, new data (i.e., data corresponding to the sub-block with the number Nsw amongst the updated data retained in the aforementioned storing unit) (step S19).

When Ns is determined not to be Nsw (Ns≠Nsw) in step S17 or after step S19, the control circuit 22 increments the number Ns by 1 (step S20), and then determines whether Ns equals to 8 (Ns=8) (step S21). If Ns=8, the control circuit 22 moves to step S25. If Ns≠8, the control circuit 22 returns to step S17.

When determining, in step S14, that the count value N has reached 1000, the control circuit 22 controls the column decoder 21b and the row decoder 24 to erase data from all the sub-blocks 21d1 to 21d8 (step S22). Subsequently, the control circuit 22 controls the column decoder 21b and the row decoder 24 to write, into all the sub-blocks 21d1 to 21d8, new data (i.e., the updated data retained in the aforementioned storing unit) (step S23).

After step S23, the control circuit 22 resets the count value N to 0 (step S24). After step S24, the control circuit 22 moves to step S25. Then, with each reception of a reprogramming command, the control circuit 22 repeats the process from step S12.

Note that, for example, the following erasing operation takes place in steps S18 and S22.

Figure 9:
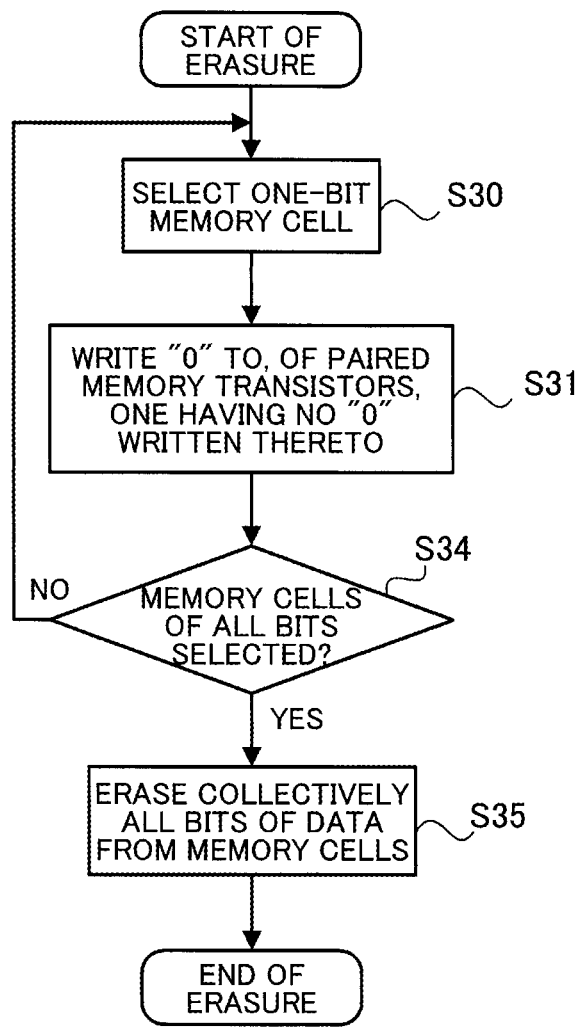
FIG. 9 is a flowchart illustrating an exemplary flow of an erasing operation.

FIG. 9 is a flowchart illustrating an exemplary flow of an erasing operation.

The control circuit 22 first selects a one-bit memory cell included in the sub-block or the memory cell array 21d to be erased (step S30). Then, the control circuit 22 controls the column decoder 21b and the row decoder 24 to write "0" into, of the paired memory transistors of the selected one-bit memory cell, a memory transistor having no "0" written thereto (step S31). Note that step S31 is implemented by the control circuit 22 referring to the data of all the memory cells of the memory cell array 21d, read in step S12 above.

Subsequently, the control circuit 22 determines whether memory cells of all bits in the erase-target sub-block or memory cell array 21d have been selected (step S34). If the memory cells of all the bits have yet to be selected, the control circuit 22 returns to step S30. If the memory cells of all the bits have been selected, the control circuit 22 controls the column decoder 21b and the row decoder 24 to erase all the bits of data from the memory cells included in the erase-target sub-block or memory cell array 21d (step S35), and then ends the erasing operation.

Note that the sequence of the processing steps in each of FIGS. 8 and 9 is merely an example and may be changed appropriately.

According to the non-volatile memory 20 and the reprogramming method described above, reprogramming is performed on a sub-block basis until the number of reprogramming operations reaches a predetermined number (1000 in the above example). This improves energy efficiency and, therefore, reduces power consumption compared to the case of performing a sector-based reprogramming operation every time.

In the case, for example, where the 1K-byte sub-blocks 21d1 to 21d8 are the unit of reprogramming as illustrated in FIG. 7, energy reduction is achieved as follows. When the amount of data reprogrammed in each reprogramming operation is always less than or equal to 1K bytes, in 999 out of 1000 reprogramming operations, energy to reprogram is one-eighth of that needed for a sector-based reprogramming operation. Because a sector-based reprogramming operation is performed only once in every 1000 reprogramming operations, the energy consumption is reduced to about one-eighth compared to the case of performing a sector-based reprogramming operation every time.

In addition, according to the aforementioned non-volatile memory 20 and the reprogramming method, it is possible to reduce degradation of stored data, as described above.

(c) Third Embodiment

A non-volatile memory according to a third embodiment is implemented using the same hardware configuration as that of the non-volatile memory 20 of FIG. 2. Note however that the non-volatile memory of the third embodiment differs in how the control circuit 22 controls the column decoder 21b and the row decoder 24, as described below.

In the non-volatile memory according to the third embodiment, the control circuit 22 controls the column decoder 21b and the row decoder 24 to have, as the unit of reprogramming, memory cell groups individually connected to one of a plurality of word lines until the number of reprogramming operations involving erasures reaches a predetermined number. Then, when the number of reprogramming operations reaches the predetermined number, the control circuit 22 controls the column decoder 21b and the row decoder 24 to reprogram the entire memory cell array. In addition, the control circuit 22 resets the number of reprogramming operations each time it reaches the predetermined number.

In the case of performing reprogramming operations on a memory cell group basis, where the memory cell groups are individually connected to one of the word lines, unselected memory cell groups are affected by drain disturb because they share the same bit lines as a reprogramming-target memory cell group.

Assume, for example, that a reprogramming operation is performed on a memory cell group connected to the word line WL0 in the memory cell array 21d of FIG. 3. The remaining unselected memory cell groups, that is, memory cell groups individually connected to the word lines WL1 to WLy, are subject to drain disturb.

Memory cell groups left continuously unselected a number of times during reprogramming operations are heavily affected by drain disturb. Then, once the number of erasures exceeds 10, the threshold voltages Vth of memory cells (memory transistors) in erased state start increasing further and eventually exceed the acceptable level of shifts in the threshold voltages Vth, as illustrated in FIG. 5.

According to the non-volatile memory of the third embodiment, the control circuit 22 causes the column decoder 21b and the row decoder 24 to carry out sector-based reprogramming, for example, each time the number of reprogramming operations (i.e., the number of erasures) reaches 10. Suppose that nine reprogramming operations have been completed, in each of which one of the memory cell groups individually connected to one of the word lines in the memory cell array 21d is a reprogramming target. Even if there is a memory cell group which was never targeted for reprogramming during the nine reprogramming operations, it is subject to reprogramming in the 10th reprogramming operation. This prevents shifts in the threshold voltages Vth due to drain disturb from exceeding the acceptable level and also restores the shifted threshold voltages Vth back to normal, thereby reducing degradation of stored data.

In the case of having, as the unit of reprogramming, memory cell groups individually connected to one of a plurality of word lines, different memory cell groups do not share word lines. Therefore, during each memory cell group-based reprogramming operation involving erasure, memory cells of unselected memory cell groups are free from the influence of gate disturb.

Next described is an example of how the non-volatile memory according to the third embodiment operates during reprogramming operations.

The following description focuses on reprogramming operations on memory cells included in the memory cell array 21d of the sector 21a1. Note, however, that reprogramming operations on memory cells included in memory cell arrays of the remaining sectors 21a2 to 21am are performed in a similar manner.

Figure 10:
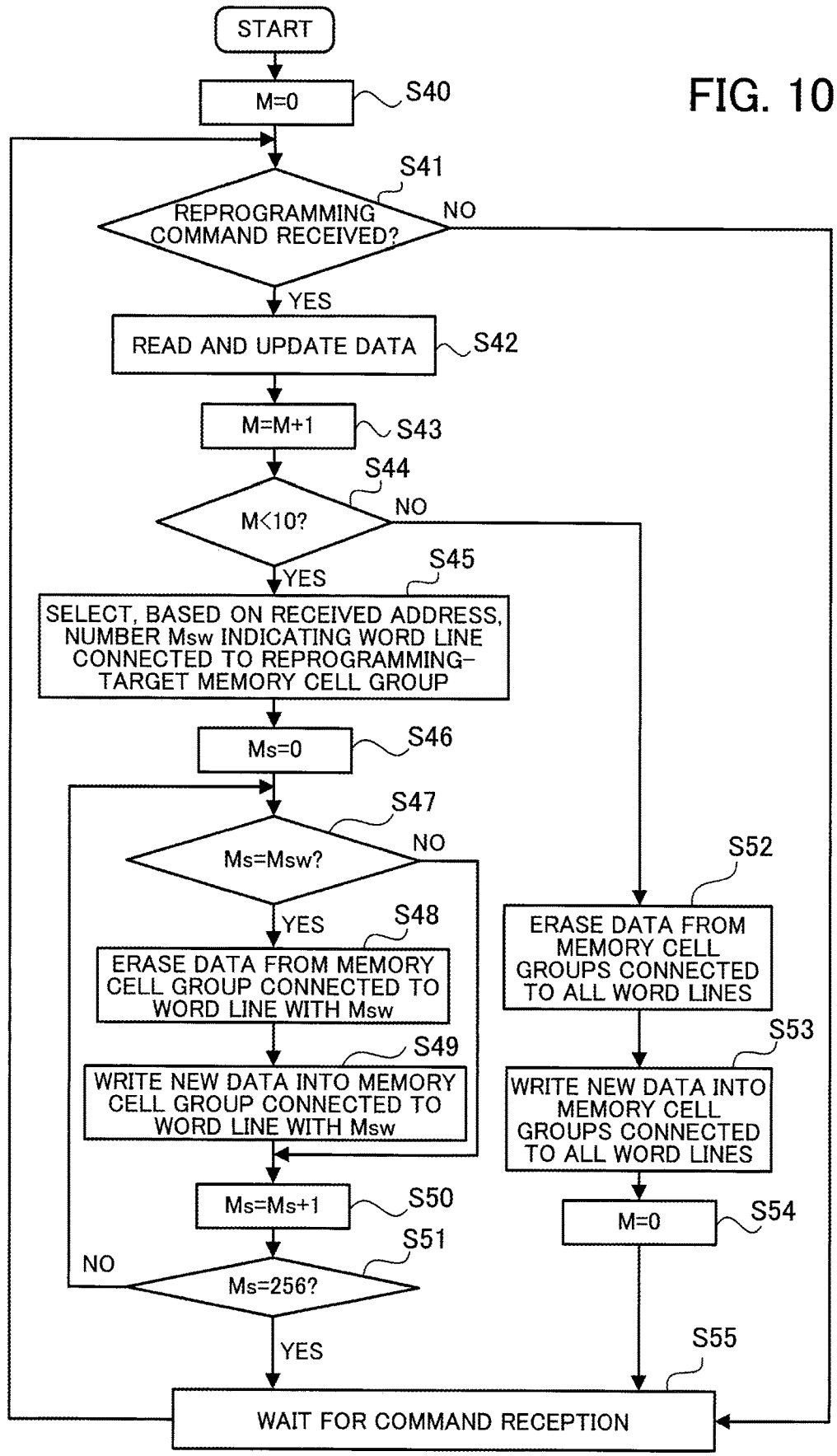
FIG. 10 is a flowchart illustrating an exemplary operation flow of a non-volatile memory of a third embodiment during reprogramming.

FIG. 10 is a flowchart illustrating an exemplary operation flow of the non-volatile memory of the third embodiment during reprogramming.

First, the control circuit 22 initializes a count value M of the counter 22a to 0 (step S40). The count value M indicates the number of reprogramming operations, each targeting one of the memory cells included in the memory cell array 21d (more specifically, in the non-volatile memory according to the third embodiment, the number of reprogramming operations, each targeting a memory cell group connected to one of the word lines).

After step S40, the control circuit 22 determines whether to have received a command for reprogramming a memory cell in the memory cell array 21d (step S41). If having not received such a reprogramming command, the control circuit 22 enters a wait state (step S55) and then returns to step S41.

If having received a command for reprogramming a memory cell in the memory cell array 21d, the control circuit 22 reads data stored in all the memory cells of the memory cell array 21d and causes a storing unit (not illustrated) to temporarily retain the read data. Subsequently, the control circuit 22 updates the data retained in the storing unit with new data supplied together with the reprogramming command (step S42).

Subsequently, the control circuit 22 increments the count value M of the counter 22a by 1 (step S43) and determines whether the count value M is less than 10 (step S44). Note that the value of 10 is set in consideration of the acceptable level of shifts in the threshold voltages Vth illustrated in FIG. 5; however, this value is merely an example and the embodiments herein are not limited in this respect.

If the count value M is less than 10, the control circuit 22 selects a number that indicates a word line connected to a reprogramming-target memory cell group, based on a received address (step S45). The number indicating a word line connected to a reprogramming-target memory cell group is hereinafter referred to as the number Msw. Suppose in the following example that the memory cell array 21d of FIG. 3 has 256 word lines WL0 to WLy and the number Msw, therefore, ranges from 0 to 255. The number Msw is retained, for example, in a register (not illustrated).

Next, the control circuit 22 sets a number Ms (ranging from 0 to 255) for identifying a word line to 0 (step S46). The number Ms may be indicated by a counter (different from the counter 22a).

Subsequently, the control circuit 22 determines whether Ms is equal to Msw (Ms=Msw) (step S47). If Ms=Msw, the control circuit 22 controls the column decoder 21b and the row decoder 24 to erase data from a memory cell group connected to a word line with the number Msw (step S48). The control circuit 22 then controls the column decoder 21b and the row decoder 24 to write new data into the memory cell group connected to the word line with the number Msw (step S49). The new data written here is, amongst the updated data retained in the aforementioned storing unit, data corresponding to the memory cell group connected to the word line with the number Msw.

When Ms is determined not to be Msw (Ms≠Msw) in step S47 or after step S49, the control circuit 22 increments the number Ms by 1 (step S50), and then determines whether Ms equals to 256 (Ms=256) (step S51). If Ms=256, the control circuit 22 moves to step S55. If Ms≠256, the control circuit 22 returns to step S47.

When determining, in step S44, that the count value M has reached 10, the control circuit 22 controls the column decoder 21b and the row decoder 24 to erase data from memory cell groups connected to all the word lines (step S52). Subsequently, the control circuit 22 controls the column decoder 21b and the row decoder 24 to write new data (the updated data retained in the aforementioned storing unit) into the memory cell groups connected to all the word lines (step S53).

After step S53, the control circuit 22 resets the count value M to 0 (step S54). After step S54, the control circuit 22 moves to step S55. Then, with each reception of a reprogramming command, the control circuit 22 repeats the process from step S42.

Note that the sequence of the processing steps in FIG. 10 is merely an example and may be changed accordingly. In addition, the erasing operation in each step S48 and S52 is the same as that illustrated in FIG. 9.

According to the non-volatile memory and the reprogramming method of the third embodiment, reprogramming is performed on a memory cell group basis, where memory cell groups are individually connected to one of a plurality of word lines, until the number of reprogramming operations reaches a predetermined number (10 in the above example). This improves energy efficiency and, therefore, reduces power consumption compared to the case of performing a sector-based reprogramming operation every time.

Assume, for example, that the number of word lines WL0 to WLy arranged in the memory cell array 21d of FIG. 3 is 256. In this case, in 9 out of 10 erasing operations associated with reprogramming, energy needed for erasure is 1/256 of that needed for a sector-based erasure.

In addition, according to the non-volatile memory and the reprogramming method of the third embodiment, it is possible to reduce degradation of stored data, as described above.

(d) Fourth Embodiment

Figure 11:
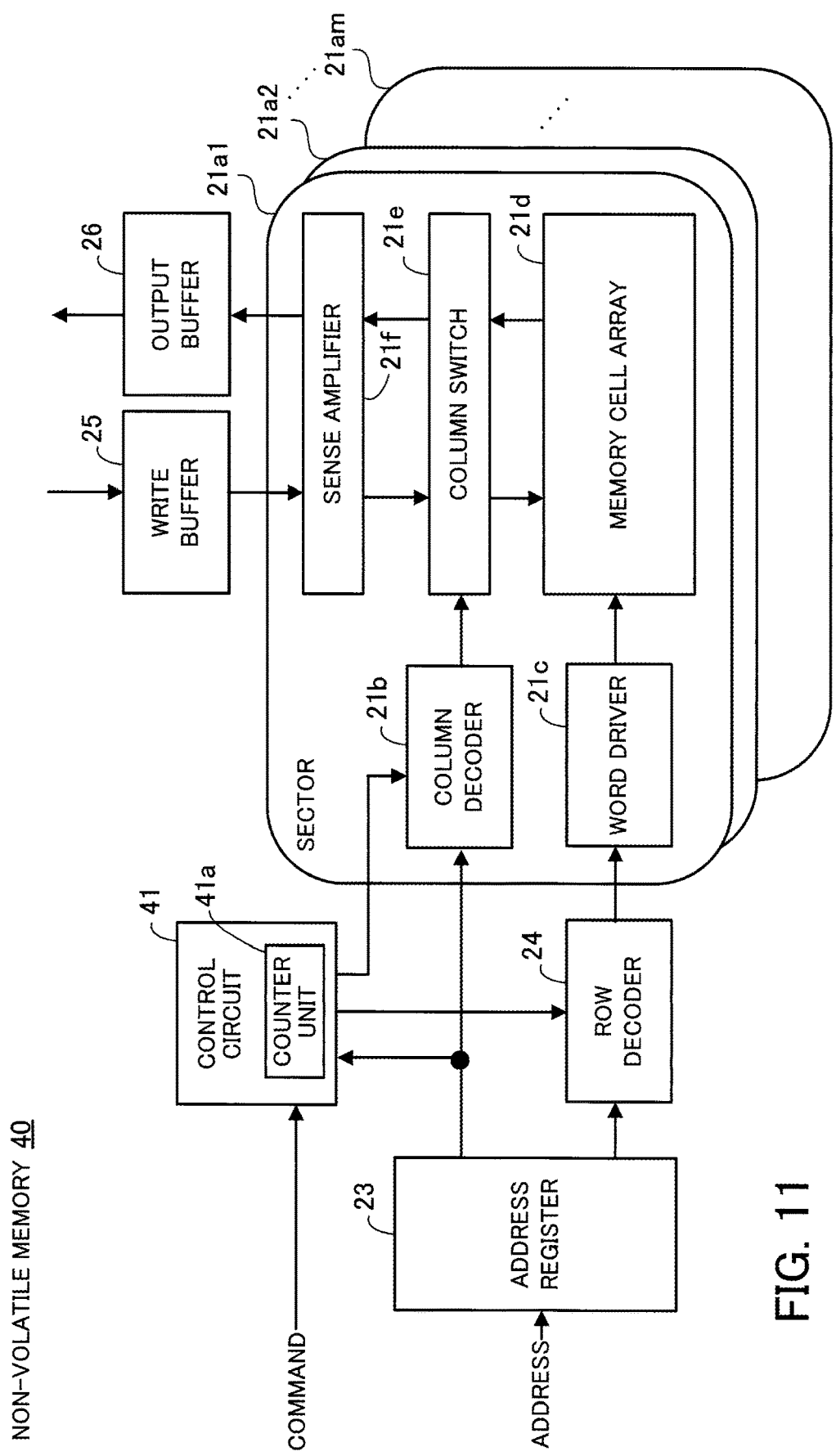
FIG. 11 illustrates an exemplary non-volatile memory according to a fourth embodiment.

FIG. 11 illustrates an exemplary non-volatile memory according to a fourth embodiment. In FIG. 11, like reference numerals refer to identical components depicted in FIG. 2.

A non-volatile memory 40 according to the fourth embodiment is implemented using almost the same hardware configuration as that of the non-volatile memory 20 of FIG. 2. Note however that the non-volatile memory 40 differs in a control circuit 41 having a counter unit 41a.

The counter unit 41a includes a plurality of counters, each dedicated to one of a plurality of bit lines and used to count the number of reprogramming operations, each of which targets one of a plurality of memory cells sharing the corresponding bit line. The counter unit 41a may also include a plurality of counters, each dedicated to one of a plurality of word lines and used to count the number of reprogramming operations, each of which targets one of a plurality of memory cells sharing the corresponding word line.

Until the number of reprogramming operations, each targeting one of a plurality of memory cells sharing the same bit line, reaches a predetermined number, the control circuit 41 controls the column decoder 21b and the row decoder 24 to have the memory cells as the unit of reprogramming. Herewith, memory cell-based (bit-by-bit) reprogramming operations are implemented. The number of reprogramming operations, each targeting one of a plurality of memory cells sharing the same bit line, is hereinafter denoted by M(j), where j is the number indicating one of the bit lines (in the case of the memory cell array 21d of FIG. 3, one of the bit line pairs). M(j)'s for the individual bit lines are counted by a plurality of counters included in the counter unit 41a. Note that the aforementioned predetermined number is set to, for example, 10 in consideration of the acceptable level of shifts in the threshold voltages Vth due to drain disturb illustrated in FIG. 5.

When each M(j) reaches the predetermined number, the control circuit 41 controls the column decoder 21b and the row decoder 24 to perform reprogramming that targets all the memory cells sharing a bit line indicated by the number j. Herewith, a bit line-based reprogramming operation (in the case of the memory cell array 21d of FIG. 3, a bit line pair-based reprogramming operation) is implemented.

Note that the control circuit 41 may cause counters included in the counter unit 41a to count the number of reprogramming operations, each targeting one of a plurality of memory cells sharing the same word line. This number of reprogramming operations is hereinafter denoted by N(i), where i is the number indicating one of the word lines. N(i)'s for the individual word lines are counted by a plurality of counters included in the counter unit 41a.

Then, when one of N(i)'s reaches a predetermined number, the control circuit 41 controls the column decoder 21b and the row decoder 24 to perform reprogramming that targets the entire memory cell array 21d. Herewith, a sector-based reprogramming operation is implemented. Note that the aforementioned predetermined number is set to, for example, 1000 in consideration of the acceptable level of shifts in the threshold voltages Vth due to gate disturb illustrated in FIG. 6.

When a reprogramming operation is performed on a memory cell basis, unselected memory cells sharing the same bit or word line as a reprogramming-target memory cell are subject to drain or gate disturb.

According to the non-volatile memory 40, the control circuit 41 causes the column decoder 21b and the row decoder 24 to perform reprogramming targeting all the memory cells sharing a bit line with the number j, for example, each time M(j) reaches 10. Suppose in this case that nine reprogramming operations have been completed, in each of which one of a plurality of memory cells sharing the same bit line is a reprogramming target. Even if there is a memory cell on the bit line, not targeted for reprogramming during the nine reprogramming operations, it is subject to reprogramming in the 10th operation. This reduces degradation of stored data caused by shifts in the threshold voltages due to drain disturb.

In addition, the control circuit 41 of the non-volatile memory 40 causes the column decoder 21b and the row decoder 24 to carry out sector-based reprogramming, for example, each time one of N(i)'s reaches 1000. Suppose in this case that 999 reprogramming operations have been completed, in each of which one of a plurality of memory cells sharing the same word line is a reprogramming target. Even if there is a memory cell on the word line, not targeted for reprogramming during the 999 reprogramming operations, it is subject to reprogramming in the 1000th operation. This reduces degradation of stored data caused by shifts in the threshold voltages due to gate disturb.

Next described is an example of how the non-volatile memory according to the fourth embodiment operates during reprogramming operations.

The following description focuses on reprogramming operations on memory cells included in the memory cell array 21d of the sector 21a1. Suppose that the memory cell array 21d includes 256 word lines and 256 bit lines (or 256 bit line pairs). Note that reprogramming operations on memory cells included in memory cell arrays of the remaining sectors 21a2 to 21am are performed in the same manner.

Figure 12:
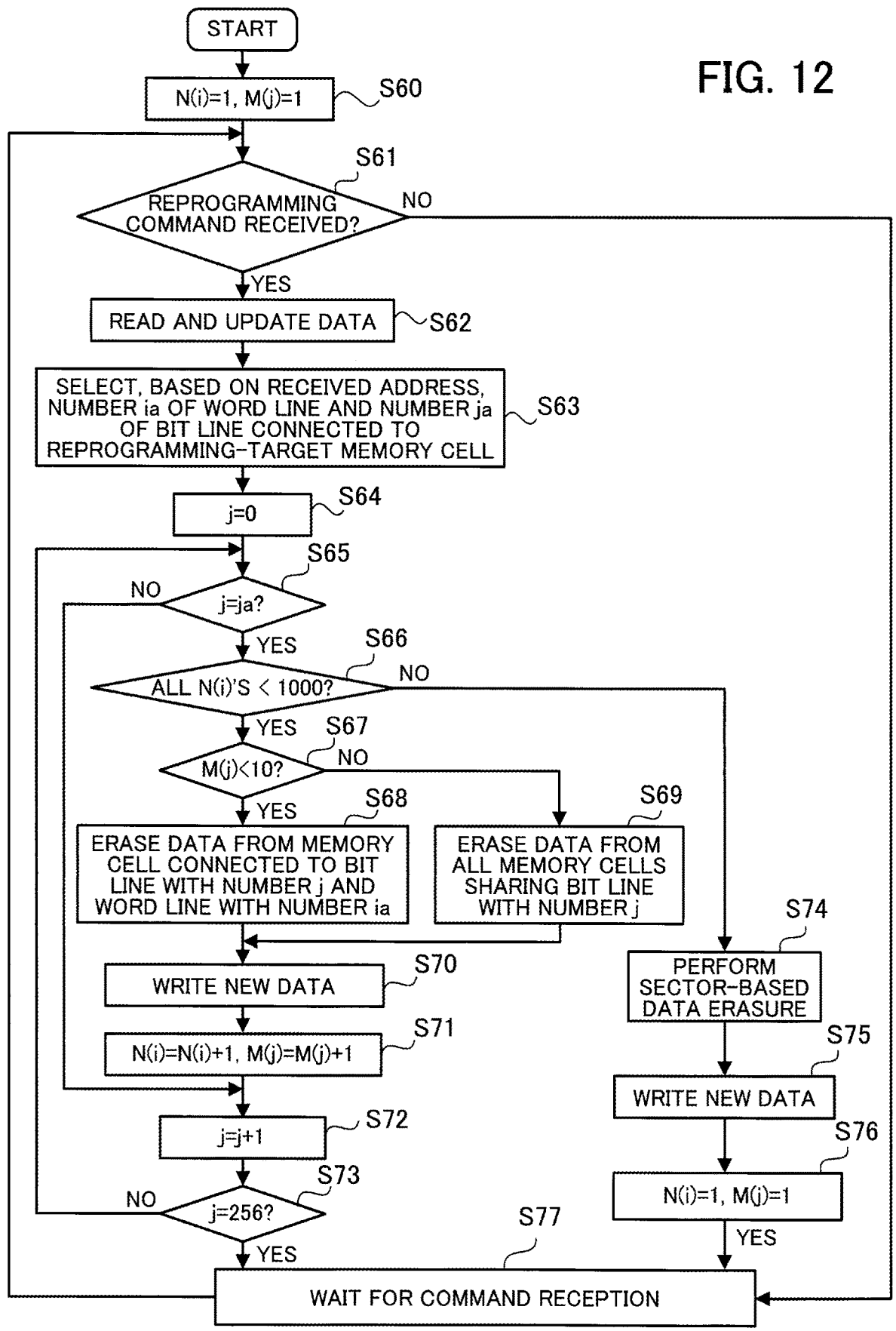
FIG. 12 is a flowchart illustrating an exemplary operation flow of the non-volatile memory of the fourth embodiment during reprogramming.

FIG. 12 is a flowchart illustrating an exemplary operation flow of the non-volatile memory of the fourth embodiment during reprogramming.

First, the control circuit 41 initializes each N(i) (i=0 to 255) and each M(j) (j=0 to 255) to 1 (step S60). After step S60, the control circuit 41 determines whether to have received a command for reprogramming a memory cell in the memory cell array 21d (step S61). If having not received such a reprogramming command, the control circuit 41 enters a wait state (step S77) and then returns to step S61.

If having received a command for reprogramming a memory cell in the memory cell array 21d, the control circuit 41 reads data stored in all the memory cells of the memory cell array 21d and causes a storing unit (not illustrated) to temporarily retain the read data. Subsequently, the control circuit 41 updates the data retained in the storing unit with new data supplied together with the reprogramming command (step S62).

Then, the control circuit 41 selects, based on a received address, the number of a word line and the number of a bit line connected to the reprogramming-target memory cell (step S63). The number of the word line and that of the bit line connected to the reprogramming-target memory cell are hereinafter denoted by ia and ja, respectively. Each of the numbers ia and ja ranges from 0 to 255. The numbers ia and ja are retained, for example, in registers (not illustrated).

Next, the control circuit 41 sets the number j (ranging from 0 to 255) for identifying a bit line to 0 (step S64). The number j may be indicated by a counter included in the counter unit 41a.

Then, the control circuit 41 determines whether j equals to ja (j=ja) (step S65). If j=ja, the control circuit 41 determines whether each of all N(i)'s, where i ranges from 0 to 255, is less than 1000 (step S66). If each of all N(i)'s is less than 1000, the control circuit 41 determines whether M(j) is less than 10 (step S67).

Note that the aforementioned values of 10 and 1000 are set in consideration of the acceptable levels of shifts in the threshold voltages Vth illustrated in FIGS. 5 and 6; however, these values are merely examples and the embodiments herein are not limited in this respect.

If M(j) is less than 10, the control circuit 41 controls the column decoder 21b and the row decoder 24 to erase data from, amongst a plurality of memory cells sharing a bit line with the number j, a memory cell connected to a word line with the number ia (step S68). On the other hand, when M(j) reaches 10, the control circuit 41 controls the column decoder 21b and the row decoder 24 to erase data from all the memory cells sharing the bit line with the number j (step S69).

After step S68 or S69, the control circuit 41 controls the column decoder 21b and the row decoder 24 to write new data (the updated data retained in the aforementioned storing unit) into each memory cell having undergone the data erasure (step S70). Subsequently, the control circuit 41 increments the corresponding N(i) or N(i)'s by 1 and also increments the corresponding M(j) by 1 (step S71). Specifically, in the case of step S68 having been performed, N(ia) for the word line with the number ia is incremented. On the other hand, in the case of step S69 having been performed, N(i)'s of all the word lines with the numbers 0 to 255 (i=0 to 255) are individually incremented.

When a negative determination (NO) is obtained in step S65 (j≠ja) or after step S71, the control circuit 41 increments the number j by 1 (step S72) and then determines whether j is 256 (j=256) (step S73). If j≠256, the process returns to step S65. If j=256, the control circuit 41 moves to step S77.

When having determined in step S66 that any one of N(i)'s has reached 1000, the control circuit 41 controls the column decoder 21b and the row decoder 24 to perform a sector-based data erasure (step S74). Subsequently, the control circuit 41 controls the column decoder 21b and the row decoder 24 to write new data (the updated data retained in the aforementioned storing unit) into all the memory cells in the memory cell array 21d of the sector 21a1 (step S75).

After step S75, the control circuit 41 resets all N(i)'s (i=0 to 255) and all M(j)'s (j=0 to 255) to 1 (step S76). After step S76, the control circuit 41 moves to step S77. Then, with each reception of a reprogramming command, the control circuit 41 repeats the process from step S62.

Note that the sequence of the processing steps in FIG. 12 is merely an example and may be changed accordingly. In addition, each of the erasing operations in steps S68, S69, and S74 is the same as that illustrated in FIG. 9.

According to the non-volatile memory and the reprogramming method of the fourth embodiment, reprogramming is performed on a memory cell (bit-by-bit) basis until M(j) reaches a predetermined number (10 in the above example). This significantly improves energy efficiency and, therefore, reduces power consumption compared to the case of performing a sector-based reprogramming operation every time.

In addition, according to the non-volatile memory and the reprogramming method of the fourth embodiment, it is possible to reduce degradation of stored data, as described above.

In the above-described example of the non-volatile memory 40 according to the fourth embodiment, an erasing operation is performed on each individual memory cell sharing the same bit line (i.e., a bit-by-bit basis) until the number of reprogramming operations reaches a predetermined number (e.g. 10 reprogramming operations). To implement such data erasures, the row decoder 24 is equipped with circuitry for selectively applying a negative high voltage (e.g. −6 V as illustrated in FIG. 4B) to each of the word lines. Having said that, such circuitry to coordinate application of negative high voltages is likely to increase in complexity. One way of addressing this issue is to simplify the circuit layout of the row decoder 24 by configuring the circuitry to collectively apply the same negative high voltage to the word lines.

Figure 13:
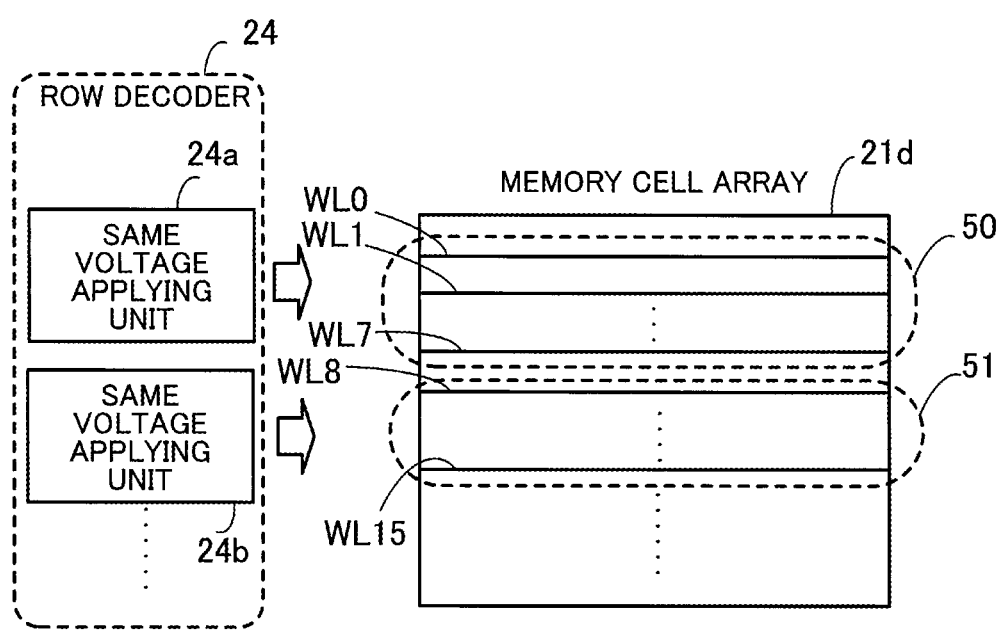
FIG. 13 illustrates an example of collectively applying negative high voltages to a plurality of word lines.

FIG. 13 illustrates an example of collectively applying negative high voltages to a plurality of word lines.

In the example of FIG. 13, the row decoder 24 includes same voltage applying units 24a and 24b, each of which collectively applies negative high voltages to its corresponding word line groups 50 and 51 made up of eight word lines (e.g. word lines WL0 to WL7, or WL8 to WL15).

According to the non-volatile memory 40 of the fourth embodiment, when negative high voltages are collectively applied to each of the word line groups 50 and 51 for data erasure, the erasure is performed byte (8 bits) by byte, not bit by bit. Thus, the minimum erase unit is larger in size; however, this has little effect on energy efficiency associated with reprogramming operations, except for cases where a region to be updated in the memory cell array 21d is very small.

In the non-volatile memory 20 of the second embodiment above, the column decoder 21b has a function of collectively applying the same voltage to a plurality of bit lines included in each of the sub-blocks 21d1 to 21d8, although there is no specific mention of this in the second embodiment above.

Figure 14:
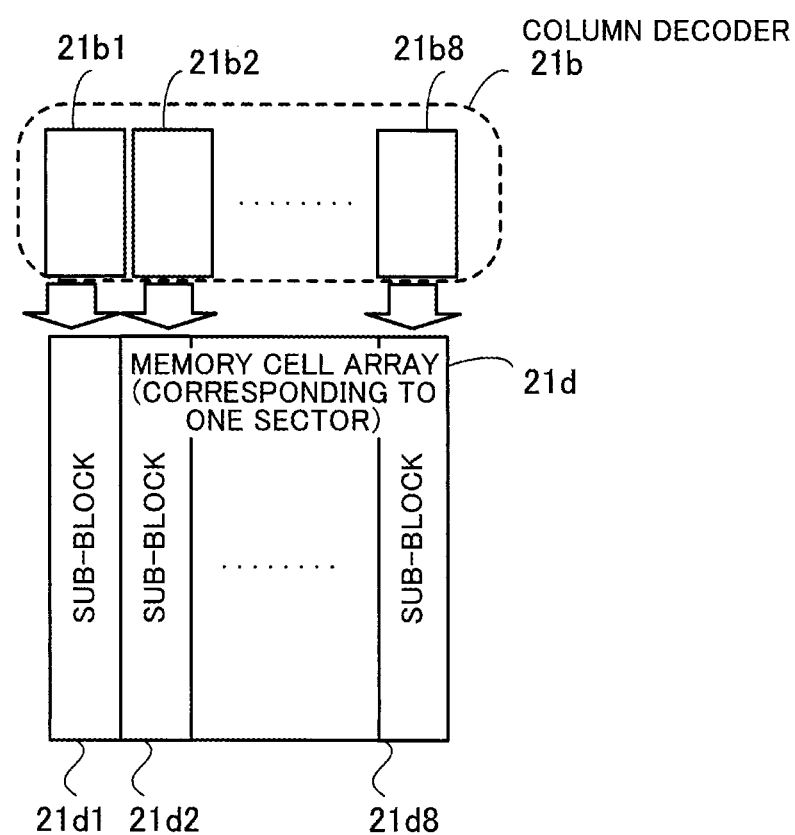
FIG. 14 illustrates a column decoder applying the same voltage to each sub-block.

FIG. 14 illustrates a column decoder applying the same voltage to each sub-block.

The column decoder 21b includes eight same voltage applying units 21b1, 21b2, . . . , and 21b8, which are provided as many as the number of the sub-blocks 21d1 to 21d8. For data erasure, each of the same voltage applying units 21b1 to 21b8 collectively applies the same voltage to a plurality of bit lines included in its corresponding sub-block.

Thus, to achieve data erasure, the column decoder 21b collectively applies the same voltage to a plurality of bit lines included in each sub-block, rather than applies a voltage to each bit line. Herewith, the circuit layout is simplified.

Non-volatile memories equipped with memory cell arrays including floating gate memory cells may also carry the risk of data degradation caused by gate disturb when the unit of reprogramming is set smaller than the sector size, as described below. For this reason, it is desirable to prevent data degradation, for example, using a similar technique to that of the non-volatile memory 20 according to the second embodiment.

Figure 15:
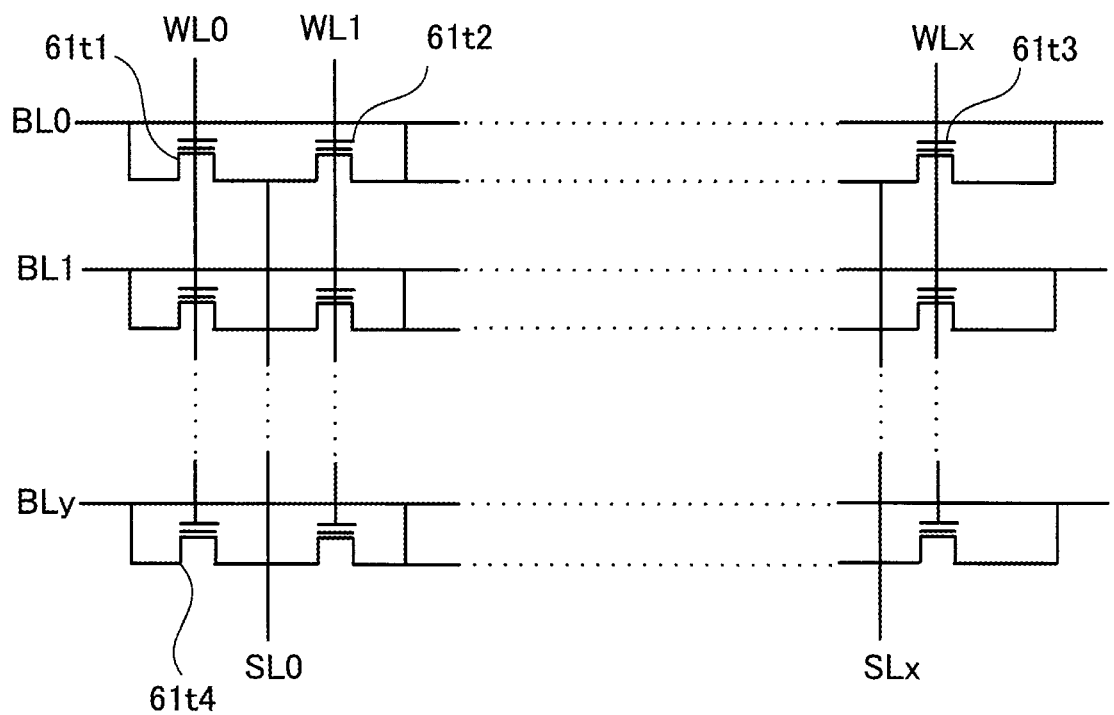
FIG. 15 illustrates an exemplary memory cell array with floating gate memory cells.

FIG. 15 illustrates an exemplary memory cell array with floating gate memory cells. A memory cell array 60 includes a plurality of memory transistors (e.g. memory transistors 61t1, 61t2, 61t3, and 61t4) each storing data by accumulating charge (hot carriers) on its floating gate.

Note that, in the memory cell array 60 of FIG. 15, each memory transistor functions as a memory cell for storing one-bit data.

The drain of each memory transistor is connected to one of bit lines BL0, BL1, . . . , and BLy. For example, the drains of the memory transistors 61t1, 61t2, and 61t3 are connected to the bit line BL0, and the drain of the memory transistor 61t4 is connected to the bit line BLy. The source of each memory transistor is connected to one of source lines SL0 to SLx. For example, the sources of the memory transistors 61t1, 61t2, and 61t4 are connected to the source line SL0, and the source of the memory transistor 61t3 is connected to the source line SLx. The gate of each memory transistor is connected to one of word lines WL0, WL1, . . . , and WLx. For example, the gates of the memory transistors 61t1 and 61t4 are connected to the word line WL0, the gate of the memory transistor 61t2 is connected to the word line WL1, and the gate of the memory transistor 61t3 is connected to the word line WLx.

Figure 16A:
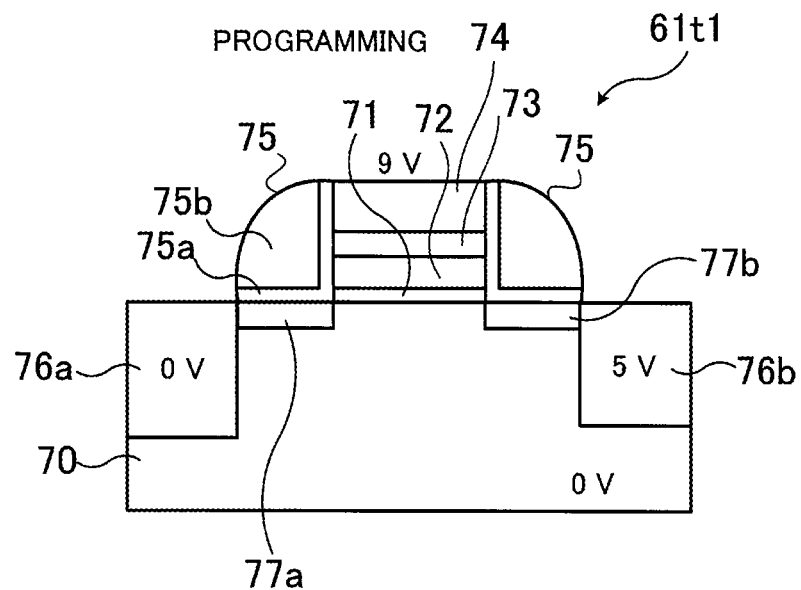
FIGS. 16A and 16B illustrate exemplary cross-section structures of a floating gate memory transistor during programming and erasure operations, respectively.
Figure 16B:
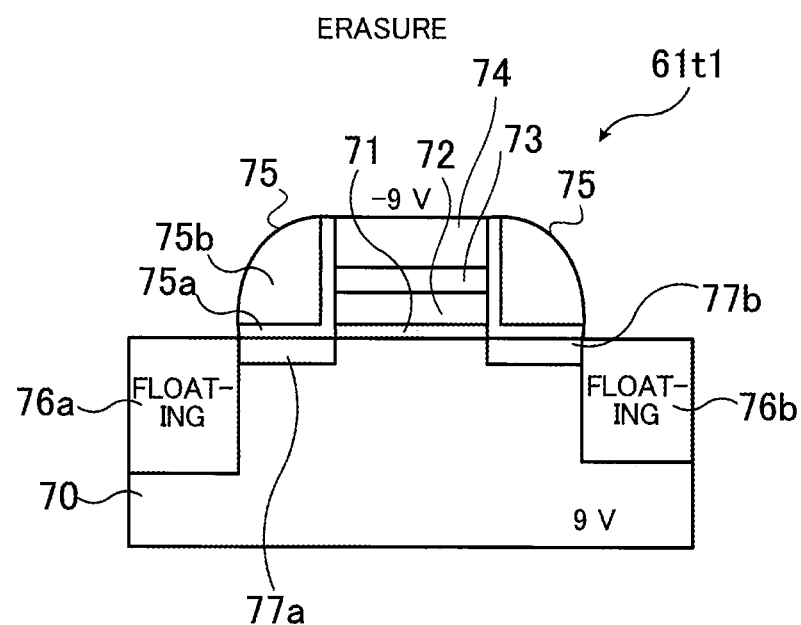

FIGS. 16A and 16B illustrate exemplary cross-section structures of a floating gate memory transistor during programming and erasure operations, respectively.

The memory transistor 61t1 includes a tunnel oxide film 71 located above a p-type semiconductor substrate 70, as well as a floating gate 72, a dielectric layer 73, and a control gate 74, which are stacked on top of one another in the stated order on the tunnel oxide film 71. The memory transistor 61t1 also includes sidewall dielectric layers 75 formed on sidewalls of the laminated structure made up of the tunnel oxide film 71, the floating gate 72, the dielectric layer 73, and the control gate 74. Each of the sidewall dielectric layers 75 includes, for example, a structure with dielectric oxide film 75a and nitride film 75b stacked on top of one another. The memory transistor 61t1 further includes impurity regions 76a and 76b formed individually in the semiconductor substrate 70 and functioning as the source and drain regions. The memory transistor 61t1 may also include LDD regions 77a and 77b each formed in the semiconductor substrate 70, on the inner side of the impurity regions 76a and 76b, respectively, below the sidewall dielectric layers 75.

During programming the above-described memory transistor 61t1, for example, the semiconductor substrate and the impurity region 76a are kept at a ground potential (e.g. 0 V) while a voltage of 5 V is applied to the impurity region 76b and a voltage of 9 V is applied to the control gate 74. Herewith, hot electrons generated near the LDD region 77b are injected into the floating gate 72 via the tunnel oxide film 71 and accumulate therein, thereby causing data to be written to the memory transistor 61t1.

On the other hand, during erasure of the memory transistor 61t1, for example, a voltage of 9 V is applied to the semiconductor substrate 70 and a voltage of −9 V is applied to the control gate 74 while the impurity regions 76a and 76b are left floating. Herewith, electrons accumulating in the floating gate 72 are released to the semiconductor substrate 70 via the tunnel oxide film 71, thereby causing data to be erased from the memory transistor 61t1.

A typical property of floating gate flash memories is sector-based collective erasure; however, they also allow selective erasure of memory cells connected to a particular word line.

For example, in the memory cell array 60 of FIG. 15, a voltage of −9 V is applied to the word line WL0 so as to erase data from a plurality of memory transistors sharing the word line WL0 (e.g. the memory transistors 61t1 and 61t4). The remaining word lines WL1 to WLx are kept at a ground potential while the bit lines BL0 to BLy and the source lines SL0 to SLx are left floating. In addition, a voltage of 9 V is applied to the semiconductor substrate 70.

At this time, memory transistors connected to the word lines WL1 to WLx (i.e. memory transistors not targeted for erasure) are affected by gate disturb. This is because the voltage of 9 V is applied to the semiconductor substrate 70 and the word lines WL1 to WLx are kept at a ground potential.

Figure 17:
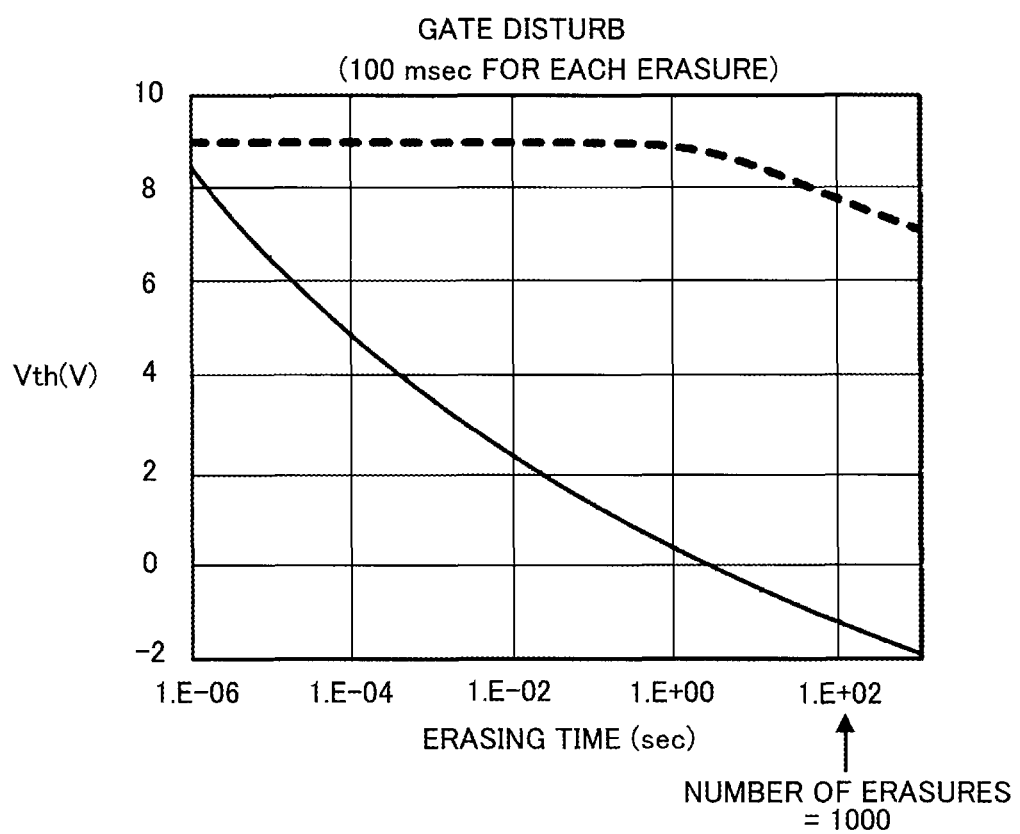
FIG. 17 illustrates impact of gate disturb occurring in unselected memory transistors during erasures.

FIG. 17 illustrates impact of gate disturb occurring in unselected memory transistors during erasures. The horizontal axis is erasing time (sec) and the vertical axis is threshold voltage Vth (V).

In FIG. 17, the solid line represents measured results of a relationship between the erasing time and the threshold voltage Vth associated with a memory transistor selected as an erasure target. The dotted line in FIG. 17 represents calculation results on the relationship between the erasing time and the threshold voltage Vth, obtained when a voltage condition of an unselected memory transistor during erasing operations is applied to a modeled device structure of the memory transistor for which the aforementioned measured results are yielded. A single erasing operation takes 100 msec. As represented in FIG. 17, when the erasing time reaches around 1.E+02 (sec) (corresponding to 1000 erasing operations), a noticeable drop in the threshold voltage Vth due to gate disturb is observed.

Therefore, in the case of setting the unit of reprogramming of the memory cell array 60 small, degradation of stored data may occur as in the case of a non-volatile memory with sidewall trapping memory cells. In view of this, as for a non-volatile memory with floating gate memory cells, reprogramming is performed on each sub-block which is formed by dividing the memory cell array 60 along a direction perpendicular to the bit lines, until the number of reprogramming operations involving erasures reaches a predetermined number (e.g. 1000).

Figure 18:
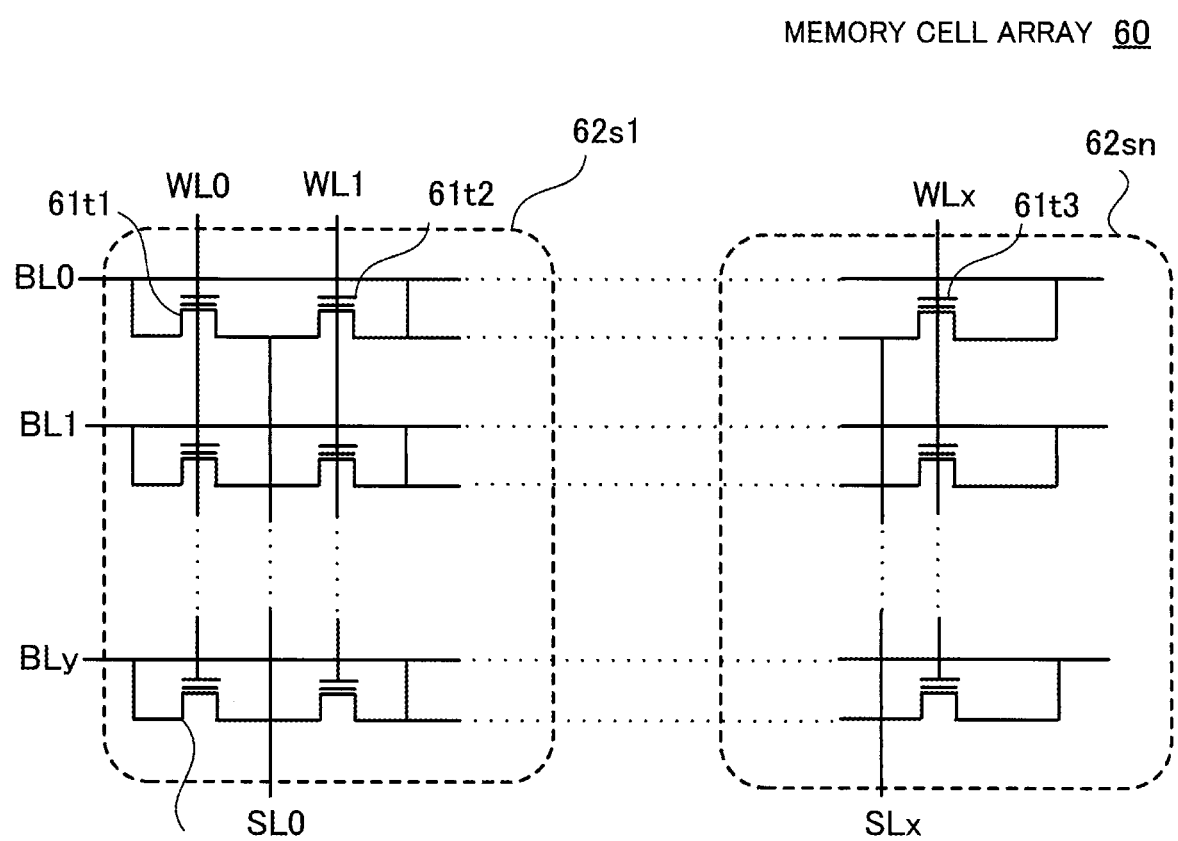
FIG. 18 illustrates an example of sub-block division.

FIG. 18 illustrates an example of sub-block division. In the example of FIG. 18, a plurality of sub-blocks 62s1 to 62sn is formed by dividing the memory cell array 60 along a direction perpendicular to the bit lines BL0 to BLy.

When the number of the reprogramming operations reaches the predetermined number, the non-volatile memory with floating gate memory cells performs collective erasure of the entire memory cell array 60. This reduces degradation of stored data caused by gate disturb.

(e) Fifth Embodiment

Note here that disturb occurs in memory cells not targeted for reprogramming (i.e., unselected memory cells) and each sharing a word or bit line with a reprogramming-target memory cell (selected memory cell), as described above. Therefore, even if the number of reprogramming operations itself has reached a predetermined number, for each memory cell included in a memory cell array, there may be a case where the number of times the memory cell remains continuously unselected has not reached the predetermined number. If this is the case, the individual memory cells of the memory cell array are only lightly affected by disturb.

A non-volatile memory according to a fifth embodiment below is configured to increase the size of the unit of reprogramming when the number of times a memory cell remains continuously unselected reaches a predetermined number, instead of when the number of reprogramming operations itself reaches a predetermined number.

Figure 19:
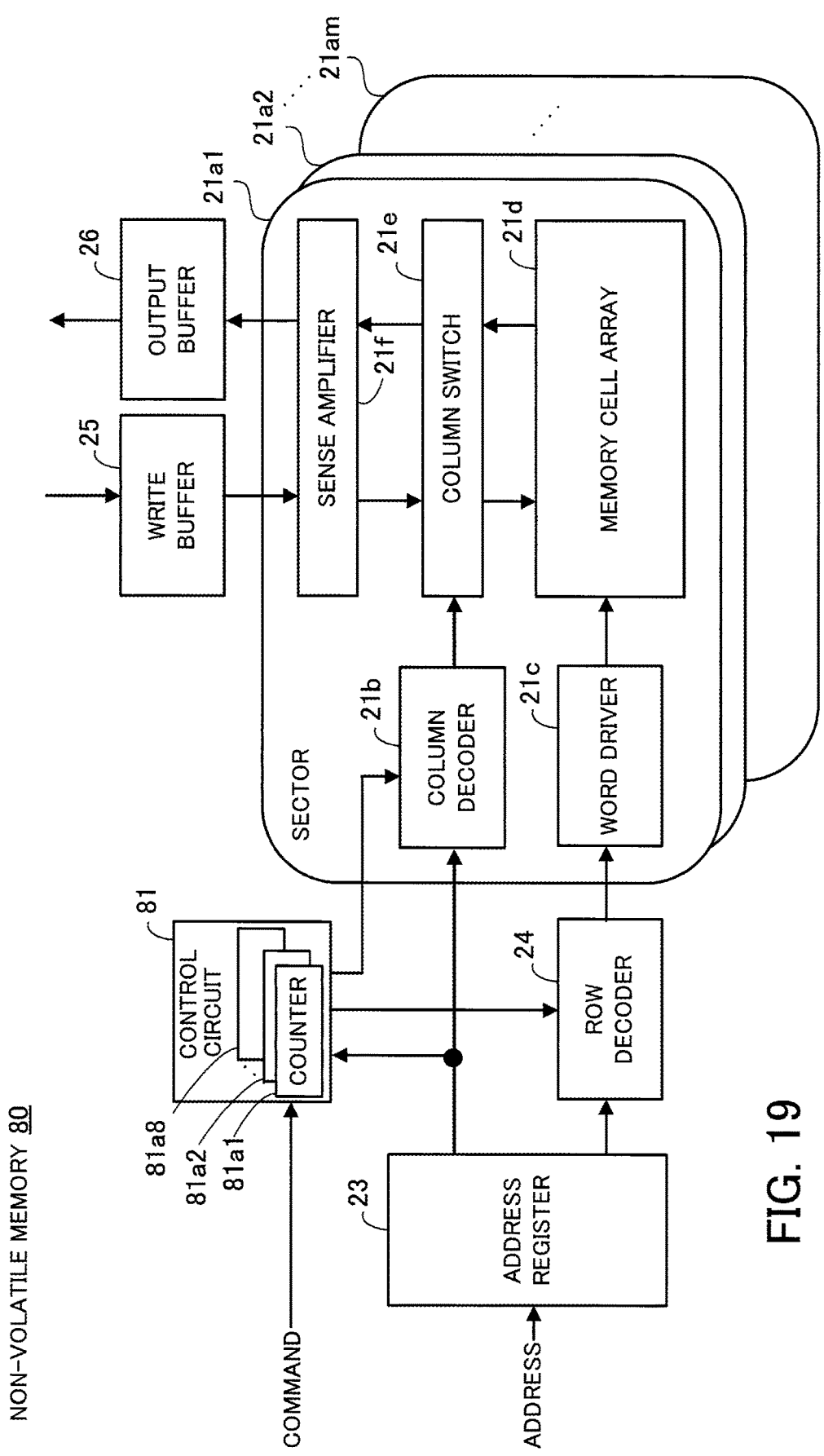
FIG. 19 illustrates an exemplary non-volatile memory according to a fifth embodiment.

FIG. 19 illustrates an exemplary non-volatile memory according to a fifth embodiment. In FIG. 19, like reference numerals refer to identical components depicted in FIG. 2.

In a non-volatile memory 80 according to the fifth embodiment, a control circuit 81 includes counters 81a1, 81a2, . . . , and 81a8 each used, for example, to count the number of times its corresponding sub-block 21d1 to 21d8 of FIG. 7 remains unselected for reprogramming. For example, the counter 81a1 counts the number of times the sub-block 21d1 remains unselected for reprogramming, and the counter 81a8 counts the number of times the sub-block 21d8 remains unselected for reprogramming.

When any of the sub-blocks 21d1 to 21d8 is reprogrammed, the control circuit 81 resets the count value of a counter corresponding to the reprogramming-target sub-block. Then, when the count value of any of the counters 81a1 to 81a8 reaches, for example, 1000, the control circuit 81 controls the column decoder 21b and the row decoder 24 to switch the unit of reprogramming from the sub-block basis to the sector basis. Note that the value of 1000 is set in consideration of the acceptable level of shifts in the threshold voltages Vth illustrated in FIG. 6; however, this value is merely an example and the embodiments herein are not limited in this respect.

Next described is an example of the aforementioned process carried out by the non-volatile memory 80, with reference to a flowchart.

Figure 20:
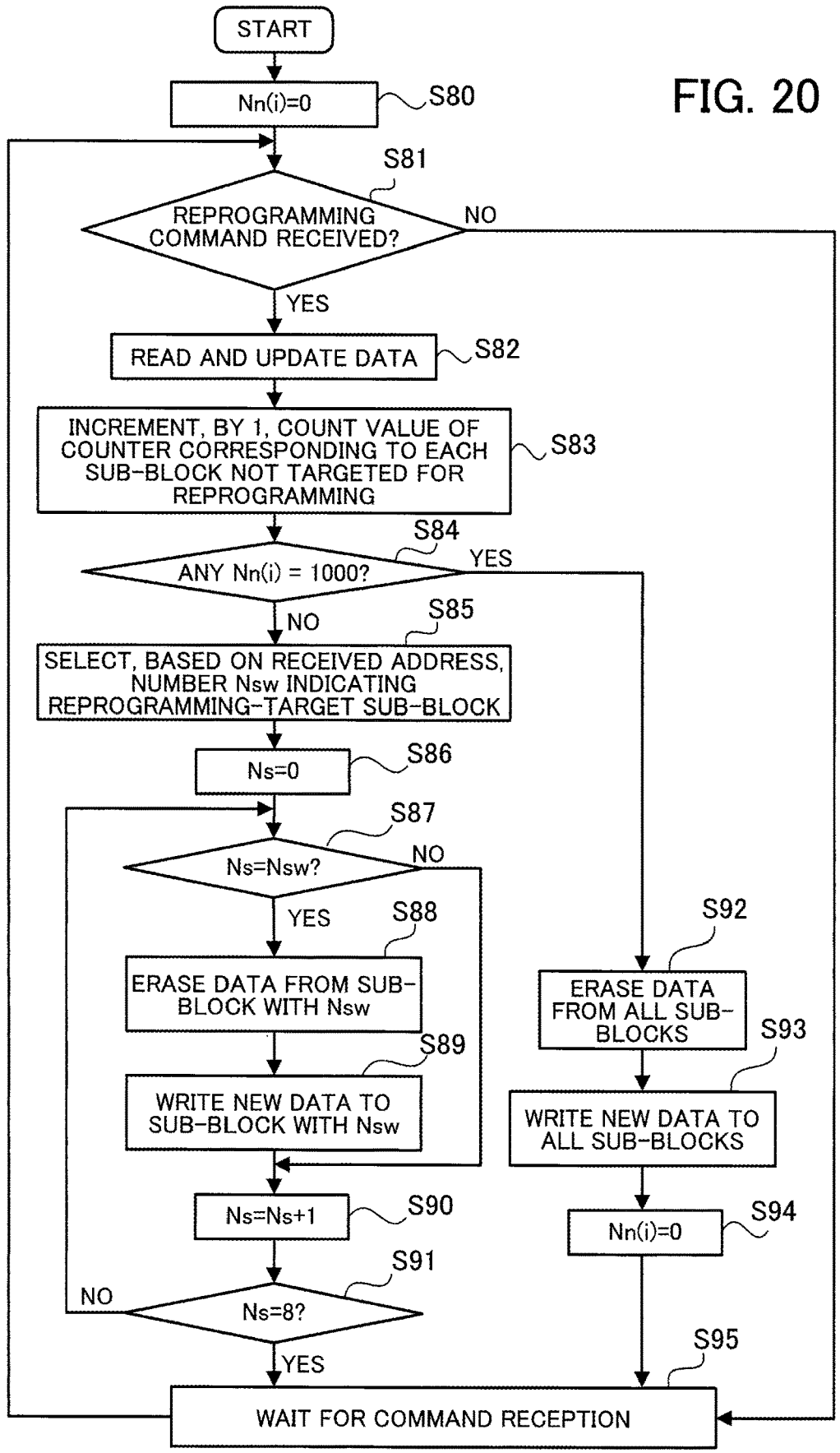
FIG. 20 is a flowchart illustrating an exemplary operation flow of a reprogramming method used by the non-volatile memory of the fifth embodiment.

FIG. 20 is a flowchart illustrating an exemplary operation flow of a reprogramming method used by the non-volatile memory of the fifth embodiment.

First, the control circuit 81 initializes count values Nn(i)'s (i=1 to 8) of the individual counters 81a1 to 81a8 to 0 (step S80). Each of the counter values Nn(i)'s indicates the number of times its corresponding sub-block 21d1 to 21d8 remains unselected for reprogramming. The procedure of steps S81 and S82 is the same as that of steps S11 and S12 in FIG. 8. After step S82, the control circuit 81 detects, based on the received address, sub-blocks not targeted for reprogramming, and increments each of the count values Nn(i)'s corresponding to the detected sub-blocks by 1 (step S83). Then, the control circuit 81 determines whether any of the count values Nn(i)'s has reached 1000 (step S84).

If none of the count values Nn(i)'s is 1000, the control circuit 81 moves to step S85. The procedure of steps S85 to S91 is the same as that of steps S15 to S21 in FIG. 8. If any of the count values Nn(i)'s is 1000, the control circuit 81 moves to step S92. The procedure of steps S92 to S93 is the same as that of steps S22 and S23 in FIG. 8. After step S93, the control circuit 81 resets the count values Nn(i)'s (i=1 to 8) to 0 (step S94). After step S94, the control circuit 81 moves to step S95 (i.e., entering a wait state). Then, with each reception of a reprogramming command, the control circuit 81 repeats the process from step S82.

According to the above-described process, when the number of times a sub-block remains continuously unselected reaches 1000, a reprogramming operation is performed on a sector basis, in other words, all the sub-blocks are targeted for reprogramming. Herewith, it is possible to prevent the unit of reprogramming from being increased in size despite all memory cells being little affected by disturb (i.e., each memory cell has a little reduction in the threshold voltage Vth), thereby further improving energy efficiency.

Having described aspects of non-volatile memories and reprogramming methods thereof based on the embodiments above, they are merely examples and the particular details of these illustrative examples shall not be construed as limitations on the appended claims.

According to one aspect, it is possible to reduce degradation of stored data even in the case of setting the size of a unit reprogrammable by decoders smaller than the size of a region selectable by the same decoders.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-volatile semiconductor memory device comprising:
   a memory cell array configured to include a plurality of word lines, a plurality of bit lines, and a plurality of memory cells each connected to one of the plurality of word lines and one of the plurality of bit lines and selected by a column decoder and a row decoder; and
   a control circuit configured to:
   control the column decoder and the row decoder to perform reprogramming where, before a count of reprogramming operations involving erasures, each targeting one of the plurality of memory cells, reaches a predetermined number, a subblock including the targeted memory cell and being smaller than an entire extent of the memory cell array is used as a unit of reprogramming, and when the count of reprogramming operations reaches the predetermined number, the entire extent of the memory cell array including the targeted memory cell and is used as the unit of reprogramming, and
   reset the count of reprogramming operations each time the count of reprogramming operations reaches the predetermined number.

2. The non-volatile semiconductor memory device according to claim 1, wherein the subblock is a first memory cell group included in each of a plurality of regions formed by dividing the memory cell array along a direction perpendicular to the plurality of word lines, and the entire extent of the memory cell array is the entire extent of the memory cell array.

3. The non-volatile semiconductor memory device according to claim 2, wherein each of the plurality of memory cells includes a sidewall trapping memory transistor.

4. The non-volatile semiconductor memory device according to claim 2, wherein the predetermined number is 1000.

5. The non-volatile semiconductor memory device according to claim 2, wherein, to erase data from memory cells included in each of the plurality of regions, the column decoder collectively applies a same voltage to a plurality of first bit lines included in the each region.

6. The non-volatile semiconductor memory device according to claim 1, wherein the subblock is a first memory cell group included in each of a plurality of regions formed by dividing the memory cell array along a direction perpendicular to the plurality of bit lines, and the entire extent of the memory cell array is the entire extent of the memory cell array.

7. The non-volatile semiconductor memory device according to claim 6, wherein each of the plurality of memory cells includes a floating gate memory transistor.

8. The non-volatile semiconductor memory device according to claim 1, wherein the subblock is each of a plurality of first memory cells that share a same one of the plurality of bit lines or a plurality of second memory cells that are selected amongst the plurality of first memory cells, the plurality of second memory cells being fewer in number than the plurality of first memory cells, and the entire extent of the memory cell array is an entire extent of the plurality of first memory cells.

9. The non-volatile semiconductor memory device according to claim 8, wherein the control circuit controls the column decoder and the row decoder to reprogram the entire extent of the memory cell array when a count of reprogramming operations involving erasures, each targeting one of a plurality of third memory cells that share a same one of the plurality of word lines, reaches a first number.

10. The non-volatile semiconductor memory device according to claim 9, wherein the predetermined number is 10, and the first number is 1000.

11. The non-volatile semiconductor memory device according to claim 8, wherein the row decoder collectively applies a same voltage to each predetermined number of word lines amongst the plurality of word lines so as to collectively erase data from the plurality of second memory cells.

12. The non-volatile semiconductor memory device according to claim 1, wherein the subblock is each first memory cell group made up of, amongst the plurality of memory cells, memory cells sharing one of the plurality of word lines.

13. The non-volatile semiconductor memory device according to claim 12, wherein the predetermined number is 10.

14. A non-volatile semiconductor memory device comprising:

a memory cell array configured to include a plurality of word lines, a plurality of bit lines, and a plurality of memory cells each connected to one of the plurality of word lines and one of the plurality of bit lines and selected by a column decoder and a row decoder; and a control circuit configured to:

control, during reprogramming operations involving erasures, each targeting a memory cell selected from the plurality of memory cells, the column decoder and the row decoder to perform reprogramming where, before a number of consecutive times an unselected memory cell sharing one of the plurality of word or bit lines with the selected memory cell remains continuously unselected reaches a predetermined number, a subblock including the selected memory cell and being smaller than an entire extent of the memory cell array is used as a unit of reprogramming, and when the number of consecutive times reaches the predetermined number, the entire extent of the memory cell array including the selected memory cell and is used as the unit of reprogramming, and reset the number of consecutive times each time the number of consecutive times reaches the predetermined number.

15. A method for reprogramming a non-volatile semiconductor memory device, the method comprising:

controlling, by a control circuit, a column decoder and a row decoder, which select one of a plurality of memory cells included in a memory cell array, to perform reprogramming in such a manner that, before a count of reprogramming operations involving erasures, each targeting one of the plurality of memory cells, reaches a predetermined number, a subblock including the targeted memory cell and being smaller than an entire extent of the memory cell array is used as a unit of reprogramming, and when the count of reprogramming operations reaches the predetermined number, the entire extent of the memory cell array including the targeted memory cell and is used as the unit of reprogramming; and resetting, by the control circuit, the count of reprogramming operations each time the count of reprogramming operations reaches the predetermined number.

16. A method for reprogramming a non-volatile semiconductor memory device, the method comprising:

controlling, by a control circuit, during reprogramming operations involving erasures, each targeting a memory cell selected from a plurality of memory cells included in a memory cell array, a column decoder and a row decoder, which select one of the plurality of memory cells, to perform reprogramming in such a manner that, before a number of consecutive times an unselected memory cell sharing one of the plurality of word or bit lines with the selected memory cell remains continuously unselected reaches a predetermined number, a subblock including the selected memory cell and being smaller than an entire extent of the memory cell array is used as a unit of reprogramming, and when the number of consecutive times reaches the predetermined number, the entire extent of the memory cell array including the selected memory cell and is used as the unit of reprogramming; and resetting, by the control circuit, the number of consecutive times each time the number of consecutive times reaches the predetermined number.

* * * * *